(12) United States Patent
Park et al.

(10) Patent No.: US 12,646,535 B2
(45) Date of Patent: Jun. 2, 2026

(54) INTEGRATED CIRCUIT INCLUDING BACKSIDE WIRING AND METHOD OF DESIGNING THE SAME

(71) Applicant: SAMSUNG ELECTRONICS CO., LTD., Suwon-si (KR)

(72) Inventors: Youngrok Park, Suwon-si (KR); Hoyoung Tang, Suwon-si (KR); Taehyung Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 260 days.

(21) Appl. No.: 18/606,790

(22) Filed: Mar. 15, 2024

(65) Prior Publication Data

US 2024/0312493 A1 Sep. 19, 2024

(30) Foreign Application Priority Data

Mar. 16, 2023 (KR) ........................ 10-2023-0034578
Jul. 20, 2023 (KR) ........................ 10-2023-0094660

(51) Int. Cl.
*G11C 5/06* (2006.01)
*G11C 11/418* (2006.01)
(Continued)

(52) U.S. Cl.
CPC ............ *G11C 5/063* (2013.01); *G11C 11/418* (2013.01); *H01L 23/5226* (2013.01); *H01L 23/5283* (2013.01); *H10B 10/12* (2023.02)

(58) Field of Classification Search
CPC ....... G11C 5/063; G11C 11/418; G11C 5/025; G11C 11/4097; H01L 23/5226; H01L 23/5283; H10B 10/12
(Continued)

(56) References Cited

U.S. PATENT DOCUMENTS 5,986,938 A 11/1999 Jang
8,982,660 B2 3/2015 Huang et al.
(Continued)

FOREIGN PATENT DOCUMENTS

KR 10-0280468 B1 3/2001
KR 10-0364801 B1 12/2002
KR 10-1294094 B1 8/2013

OTHER PUBLICATIONS

Sullivan et al., "New Ways to Wire and Integrate Chips Master Class", Prepared Remarks, Applied Materials, May 26, 2022, 26 total pages.

(Continued)

*Primary Examiner* — Fernando Hidalgo
(74) *Attorney, Agent, or Firm* — Sughrue Mion, PLLC

(57) ABSTRACT

An integrated circuit includes a substrate; a bit cell array including bit cells on the substrate; a frontside wiring layer above the substrate in a vertical direction with respect to a front side of the substrate, the frontside wiring layer including local word lines connected to the bit cells; a row decoder configured to provide word line signals for driving the bit cell array; a backside wiring layer on a backside of the substrate, the backside wiring layer including backside wiring lines configured to receive the word line signals from the row decoder; and a word line rebuffer configured to provide the word line signals received from the backside wiring lines to the local word lines.

20 Claims, 16 Drawing Sheets

(51) Int. Cl.
    *H01L 23/522*      (2006.01)
    *H01L 23/528*      (2006.01)
    *H10B 10/00*      (2023.01)

(58) Field of Classification Search
    USPC .......................................................... 365/63
    See application file for complete search history.

(56)               References Cited

U.S. PATENT DOCUMENTS

| | | |
|---|---|---|
| 9,111,637 B1 | 8/2015 | Sahu et al. |
| 2024/0276696 A1* | 8/2024 | Chung .................. G06F 30/392 |

OTHER PUBLICATIONS

Rooseleer et al., "A 40 nm, 454MHz 114 fJ/bit Area-Efficient SRAM Memory with Integrated Charge Pump", IEEE, Oct. 31, 2013, 5 total pages, DOI:10.1109/ESSCIRC.2013.6649107.

\* cited by examiner

REBUF

CELL ARRAY

REBUF

CELL ARRAY

16b

11a

13

14c

ROW
DECODER

16a

15

| FSM |
| BSM |
| BVA |

Figure 7:
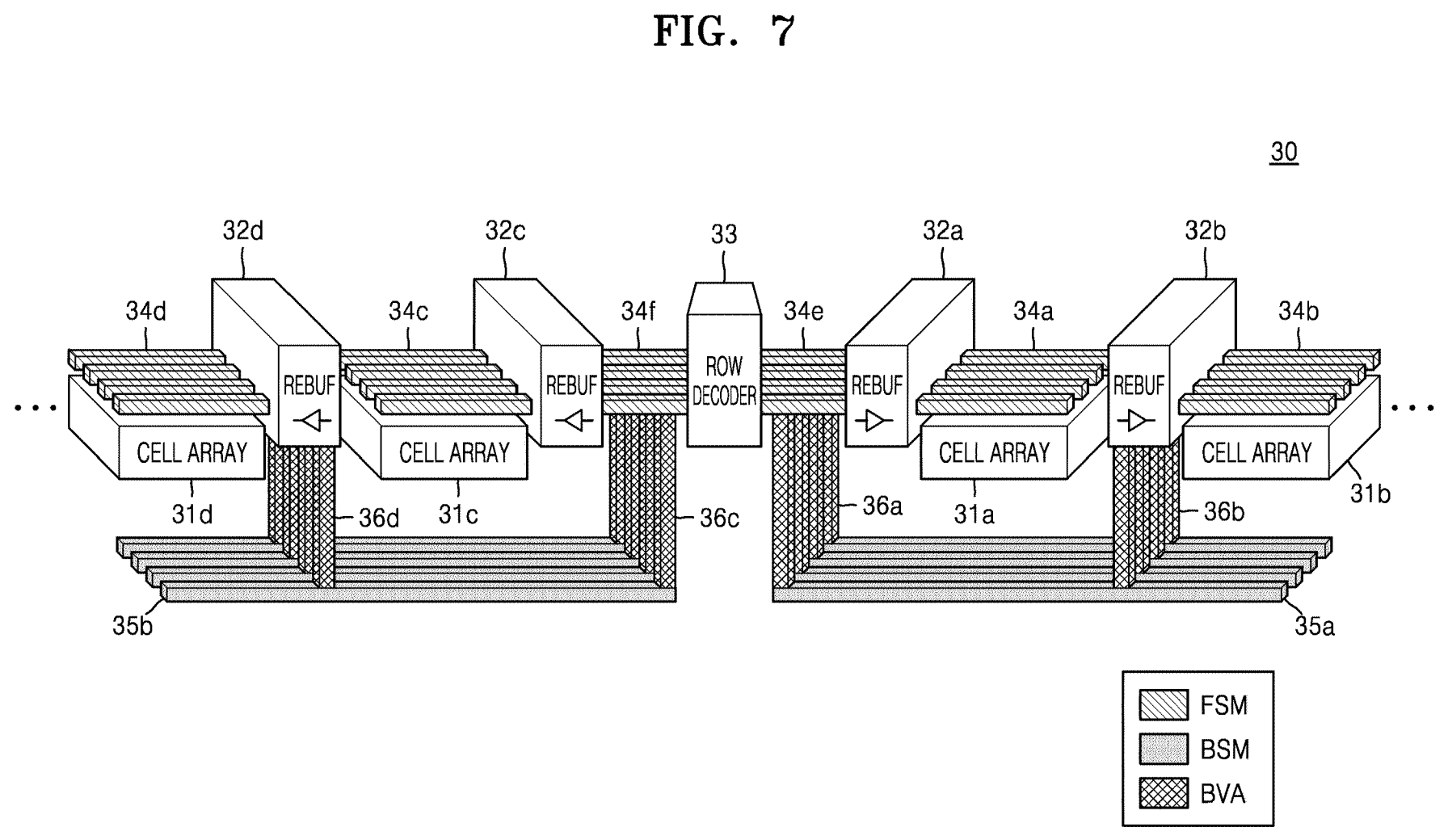

CELL ARRAY 31b
34b
32b REBUF
34a
CELL ARRAY 31a
32a REBUF
34e
36b
36a
33 ROW DECODER
34f
32c REBUF
34c
CELL ARRAY 31c
36c
36d
32d REBUF
34d
CELL ARRAY 31d
35a
35b

FSM
BSM
BVA

ROW DECODER

ROW DECODER

CELL ARRAY

CELL ARRAY

41b

43b

42b

42a

43a

41a

45b

45a

44

FSM

BSM

BVA

INTEGRATED CIRCUIT INCLUDING BACKSIDE WIRING AND METHOD OF DESIGNING THE SAME

CROSS-REFERENCE TO RELATED APPLICATION

This application is based on and claims priority under 35 U.S.C. § 119 to Korean Patent Application No. 10-2023-0034578, filed on Mar. 16, 2023, and Korean Patent Application No. 10-2023-0094660, filed on Jul. 20, 2023, in the Korean Intellectual Property Office, the disclosures of which are incorporated by reference herein in their entireties.

BACKGROUND

The present disclosure relates to integrated circuits, and more particularly, to an integrated circuit including a backside wiring and a method of designing the same.

Due to demand for high integration and advancement in semiconductor processes, the width, spacing, and/or height of wirings included in integrated circuits may decrease and the influence of parasitic elements of wirings may increase. In addition, power supply voltage of integrated circuits may decrease for reduced power consumption, high operating speed, etc., and accordingly, the influence of parasitic elements of wirings on integrated circuits may be more significant. Accordingly, there has been an increased need for a design method of integrated circuits that efficiently routes wirings and vias.

SUMMARY

One or more embodiments provide an integrated circuit that may increase routing resources of a frontside wiring layer by transmitting a word line signal or an address signal using a backside wiring layer.

According to an aspect of an embodiment, an integrated circuit includes: a substrate; a bit cell array including bit cells on the substrate; a frontside wiring layer above the substrate in a vertical direction with respect to a front side of the substrate, the frontside wiring layer including local word lines connected to the bit cells; a row decoder configured to provide word line signals for driving the bit cell array; a backside wiring layer on a backside of the substrate, the backside wiring layer including backside wiring lines configured to receive the word line signals from the row decoder; and a word line rebuffer configured to provide the word line signals received from the backside wiring lines to the local word lines.

According to an aspect of an embodiment, an integrated circuit includes: a substrate; a bit cell array including first bit cells and second bit cells arranged on the substrate; a frontside wiring layer above the substrate in a vertical direction with respect to a front side of the substrate, the frontside wiring layer including first local word lines connected to the first bit cells and second local word lines connected to the second bit cells; a backside wiring layer on a backside of the substrate, the backside wiring layer including backside wiring lines; a first row decoder configured to provide first word line signals according to a row address to the first local word lines and transmit the row address to the backside wiring lines; and a second row decoder configured to receive the row address from the backside wiring lines and provide second word line signals according to the row address to the second local word lines.

According to an aspect of an embodiment, an integrated circuit includes: a substrate; a bit cell array including first bit cells and second bit cells arranged on the substrate; a frontside wiring layer above the substrate in a vertical direction with respect to a front side of the substrate, the frontside wiring layer including first local word lines connected to the first bit cells and second local word lines connected to the second bit cells; a backside wiring layer on a backside of the substrate, the backside wiring layer including backside global word lines configured to receive word line signals for driving the bit cell array; and backside vias respectively on the backside global word lines, wherein the first local word lines or the second local word lines are configured to receive the word line signals from the backside global word lines through the backside vias.

BRIEF DESCRIPTION OF THE DRAWINGS

The above and other aspects of certain embodiments will be more clearly understood from the following detailed description taken in conjunction with the accompanying drawings, in which:

FIG. 1 is a perspective view illustrating an integrated circuit according to an embodiment;

FIG. 7 is a perspective view illustrating an integrated circuit according to an embodiment;

FIG. 9 is a perspective view illustrating an integrated circuit according to an embodiment;

FIG. 13 is a plan view illustrating an integrated circuit according to an embodiment;

DETAILED DESCRIPTION

Figure 2:
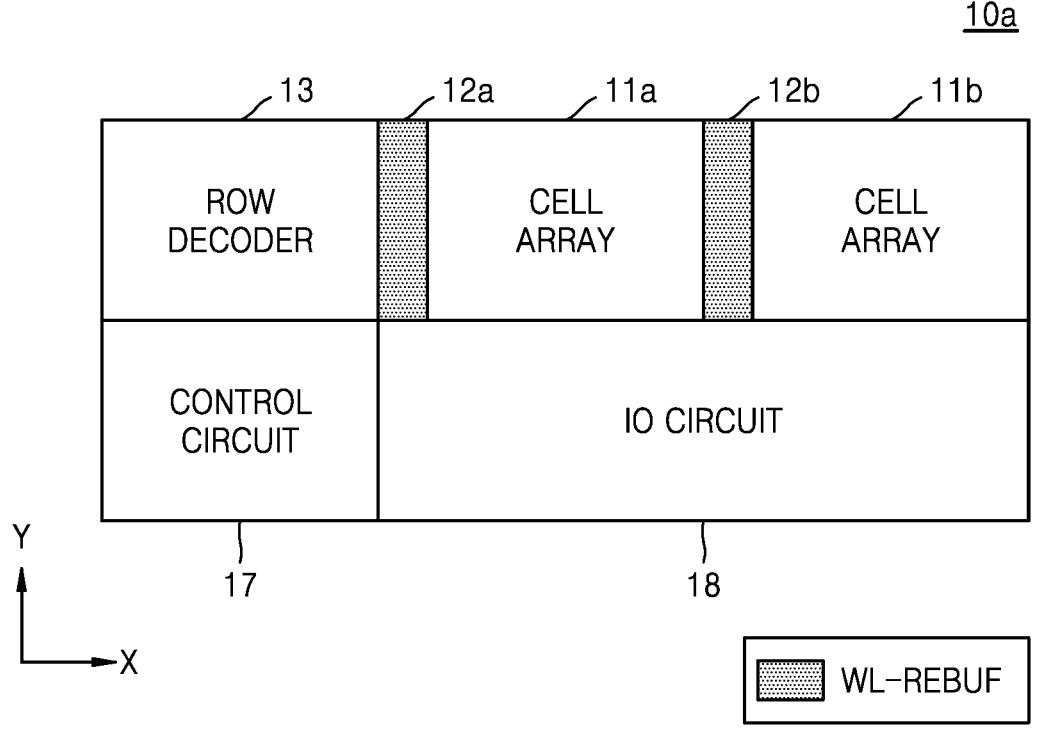
FIG. 2 is a plan view illustrating an integrated circuit according to an embodiment.

Hereinafter, embodiments will be described in detail with reference to the attached drawings. The same reference numerals are used for the same components in the drawings, and redundant descriptions thereof are omitted.

In this specification, the X-axis direction may be referred to as a first horizontal direction or a first direction, the Y-axis direction may be referred to as a second horizontal direction or a second direction, and the Z-axis direction may be referred to as a vertical direction. The plane consisting of the X and Y axes may be referred to as a horizontal plane, a component located in the +Z-axis direction relative to other components may be referred to as being on top of another component, and a component located in the −Z-axis direction relative to other components may be referred to as being below the other components.

FIG. 1 is a perspective view illustrating an integrated circuit (IC) 10 according to an embodiment.

Referring to FIG. 1, the IC 10 may include a plurality of cell arrays including a first cell array 11*a* and a second cell array 11*b*. Each of the plurality of cell arrays may include a plurality of bit cells or memory cells. For example, the first cell array 11*a* may include first bit cells and the second cell array 11*b* may include second bit cells. For example, the first and second cell arrays 11*a* and 11*b* may be arranged in the first direction X, but embodiments are not limited thereto.

The IC 10 may further include a plurality of word line rebuffers (REBUF) including a first word line rebuffer 12*a* and a second word line rebuffer 12*b*, and a row decoder 13. The row decoder 13 may provide word line signals for driving the first and second cell arrays 11*a* and 11*b*. For example, the row decoder 13 may receive a row address (e.g., ADDR_R in FIG. 5) and generate word line signals from the received row address. In this specification, the row decoder 13 may be understood as including a row driver.

The first and second cell arrays 11*a* and 11*b*, the first and second word line rebuffers 12*a* and 12*b*, and the row decoder 13 may be arranged on a substrate. In this manner, the substrate on which the first and second cell arrays 11*a* and 11*b*, the first and second word line rebuffers 12*a* and 12*b*, and the row decoder 13 are arranged may be defined as a "device layer." For example, the device layer may correspond to a device layer DL in FIG. 4. For example, the first word line rebuffer 12*a* may be located between the row decoder 13 and the first cell array 11*a*, and the second word line rebuffer 12*b* may be located between the first cell array 11*a* and the second cell array 11*b*.

If the length of a word line increases as the number of bit cells increases, resistance of the word line increases. The increase in resistance of the word line may increase IR drop, which may weaken an output signal corresponding to the word line signal, while passing through the word line. In other words, the word line signal may be attenuated.

However, the IC 10 according to the present embodiment may divide a memory cell array into a plurality of cell arrays and include a plurality of word line rebuffers respectively corresponding to the cell arrays. According to some embodiments, the word line rebuffers may also be referred to as word line buffers. The word line rebuffers may receive word line signals from the row decoder 13 through global word lines, buffer the received word line signals, and provide the buffered word line signals to corresponding cell arrays, respectively. In this manner, the output signal corresponding to the word line signal may be prevented from being reduced by using the word line rebuffers, and in other words, attenuation of the word line signal may be prevented. In addition, because the length of local word lines respectively connected to the cell arrays may be reduced, IR drop through local word lines may be reduced.

The IC 10 may further include a frontside wiring layer FSM disposed above the substrate in a vertical direction Z with respect to a first side of the substrate, for example, a front side of the substrate. The frontside wiring layer FSM may include first local word lines 14*a* and second local word lines 14*b*. The first local word lines 14*a* may be disposed above the first cell array 11*a* in the vertical direction Z and may be connected to first bit cells included in the first cell array 11*a*. The second local word lines 14*b* are disposed above the second cell array 11*b* in the vertical direction Z and may be connected to second bit cells included in the second cell array 11*b*. In addition, the frontside wiring layer FSM may further include global word lines or frontside global word lines 14*c*.

The frontside global word lines 14*c* may be located between the row decoder 13 and the first word line rebuffer 12*a* and may receive each of word line signals from the row decoder 13. The first local word lines 14*a* may respectively receive word line signals or buffered word line signals from the first word line rebuffer 12*a*. The second local word lines 14*b* may respectively receive word line signals or buffered word line signals from the second word line rebuffer 12*b*.

For example, the first local word lines 14*a* may each extend in the first direction X and be apart from each other in the second direction Y. For example, the second local word lines 14*b* may each extend in the first direction X and be apart from each other in the second direction Y. For example, the frontside global word lines 14*c* may each extend in the first direction X and be apart from each other in the second direction Y. In FIG. 1, the first and second local word lines 14*a* and 14*b* and the frontside global word lines 14*c* are shown as being at the same level, but embodiments of the disclosure are not limited thereto.

The IC 10 may further include a backside wiring layer BSM including backside wiring lines 15 disposed on a second side of the substrate, for example, the backside of the substrate. The backside wiring lines 15 may receive word line signals from the row decoder 13 and thus may respectively correspond to "backside global word lines". The backside wiring lines 15 may each extend in the first direction X and be apart from each other in the second direction Y. However, embodiments of the disclosure are not limited thereto, and the extension direction of the backside wiring lines 15 may vary according to embodiments.

The backside wiring lines 15 may include doped polysilicon, metal, conductive metal nitride, conductive metal carbide, conductive metal silicide, or combinations thereof. For example, the backside wiring lines 15 may include Al, Cu, Ti, Ta, W, Mo, TaN, NiSi, CoSi, TiN, WN, TiAl, TiAlN, TaCN, TaC, TaSiN, or combinations thereof. However, embodiments are not limited thereto.

In an embodiment, the pitch of the backside wiring lines 15 may correspond to the pitch of the first local word lines 14*a* and the pitch of the second local word lines 14*b*. For example, the pitch of the backside wiring lines 15 may be substantially the same as the pitch of the first local word lines 14*a* and the pitch of the second local word lines 14*b*. For example, the pitch of the backside wiring lines 15 may be substantially the same as the pitch of the frontside global word lines 14*c*. However, embodiments of the disclosure are not limited thereto, and the pitch of the backside wiring lines 15 may be different from the pitch of the first local word lines 14*a* and the pitch of the second local word lines 14*b*, and even in this case, embodiments may be applied. For example, the number of backside wiring lines 15 may correspond to the number of first local word lines 14*a* and the number of second local word lines 14*b*. For example, the number of backside wiring lines 15 may correspond to the number of frontside global word lines 14*c*.

The IC 10 may further include backside vias BVA disposed on the backside wiring lines 15 and extending in the vertical direction Z. The backside vias BVA may pass through the substrate in the vertical direction Z, and accordingly, may be referred to as "through-vias." The backside vias BVA may include first backside vias 16a and second backside vias 16b. The first backside vias 16a may be connected between the row decoder 13 and the backside wiring lines 15. For example, the first backside vias 16a may be respectively connected between the frontside global word lines 14c and the backside wiring lines 15. The second backside vias 16b may be respectively connected between the backside wiring lines 15 and the second word line rebuffer 12b.

In an embodiment, at least one of the backside vias BVA may pass through the substrate and be connected to a gate region of a transistor. Accordingly, the backside vias BVA may connect the backside wiring line 15 to a P-type transistor or an N-type transistor, and a voltage applied to the backside wiring line 15 may be transmitted to a gate region of the P-type transistor or N-type transistor.

In an embodiment, at least one of the backside vias BVA may pass through the substrate and be connected to a source/drain region of the transistor. Accordingly, the backside vias BVA may connect the backside wiring line 15 to the P-type transistor or the N-type transistor, and a voltage applied to the backside wiring line 15 may be directly transmitted to a source/drain region of the P-type transistor or N-type transistor. For example, a lower surface of the backside via BVA may be in contact with the backside wiring line 15, and an upper surface of the backside via BVA may be connected to the source/drain region of the P-type transistor or N-type transistor. In this manner, a structure connecting a via or contact to a lower portion of an epitaxial region, such as a source/drain region, may be referred to as direct backside contact (DBC). According to embodiments, the DBC may include a backside contact and/or a backside via.

According to the present embodiment, the backside wiring lines 15 may respectively receive word line signals from the row decoder 13 through the frontside global word lines 14c and the first backside vias 16a and transmit the word line signals to the second word line rebuffer 12b through the second backside vias 16b. The first word line rebuffer 12a may receive word line signals from the frontside global word lines 14c and provide the received word line signals to the first local word lines 14a, respectively. The second word line rebuffer 12b may receive word line signals from the backside global word lines, that is, the backside wiring lines 15, and provide the received word line signals to the second local word lines 14b, respectively.

As such, according to the present embodiment, by implementing the global word lines using the backside wiring layer BSM and implementing the local word lines using the frontside wiring layer FSM, routing freedom in the frontside wiring layer FSM may increase and a power performance area (PPA) of the IC 10 may be improved.

FIG. 2 is a plan view illustrating an IC 10a according to an embodiment.

Referring to FIG. 2, the IC 10a may include the first and second cell arrays 11a and 11b, the first and second word line rebuffers 12a and 12b, the row decoder 13, a control circuit 17, and an input/output (I/O) circuit (also referred to as an IO circuit) 18. The IC 10a may correspond to a modified example of the IC 10 of FIG. 1.

The first word line rebuffer 12a may be located between the row decoder 13 and the first cell array 11a, and the second word line rebuffer 12b may be located between the first cell array 11a and the second cell array 11b. However, embodiments are not limited thereto, and according to embodiments, the first word line rebuffer 12a may be omitted. The control circuit 17 may be located to be adjacent to the row decoder 13 in the second direction Y and may be located to be adjacent to the I/O circuit 18 in the first direction X.

Figure 3:
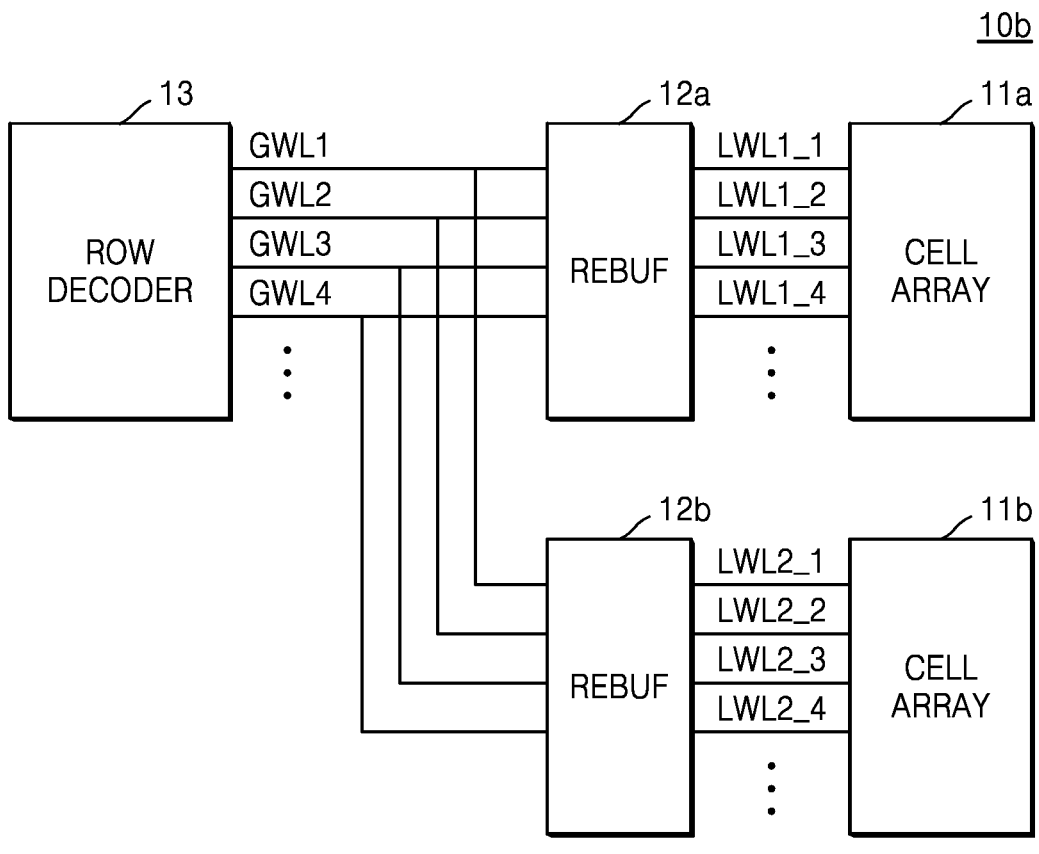
FIG. 3 illustrates a connection relationship of an integrated circuit according to an embodiment.

FIG. 3 illustrates a connection relationship of an IC 10b according to an embodiment.

Referring to FIG. 3, the IC 10b may correspond to a modified example of the IC 10 of FIG. 1 and the IC 10a of FIG. 2. The row decoder 13 may be connected to the first and second word line rebuffers 12a and 12b through global word lines GWL1 to GWL4. The first word line rebuffer 12a may be connected to the first cell array 11a through first local word lines LWL1_1 to LWL1_4. The second word line rebuffer 12b may be connected to the second cell array 11b through second local word lines LWL2_1 to LWL2_4.

Referring to FIGS. 1 and 3 together, the global word lines GWL1 to GWL4 may be implemented using the backside wiring layer BSM, and the first local word lines LWL1_1 to LWL1_4 and the second local word lines LWL2_1 to LWL2_4 may be implemented using the frontside wiring layer FSM. For example, the global word lines GWL1 to GWL4 may be implemented through the frontside global word lines 14c, first backside vias 16a, backside wiring lines 15, and second backside vias 16b. For example, the first local word lines LWL1_1 to LWL1_4 may be implemented as first local word lines 14a. For example, the second local word lines LWL2_1 to LWL2_4 may be implemented as second local word lines 14b.

Figure 4:
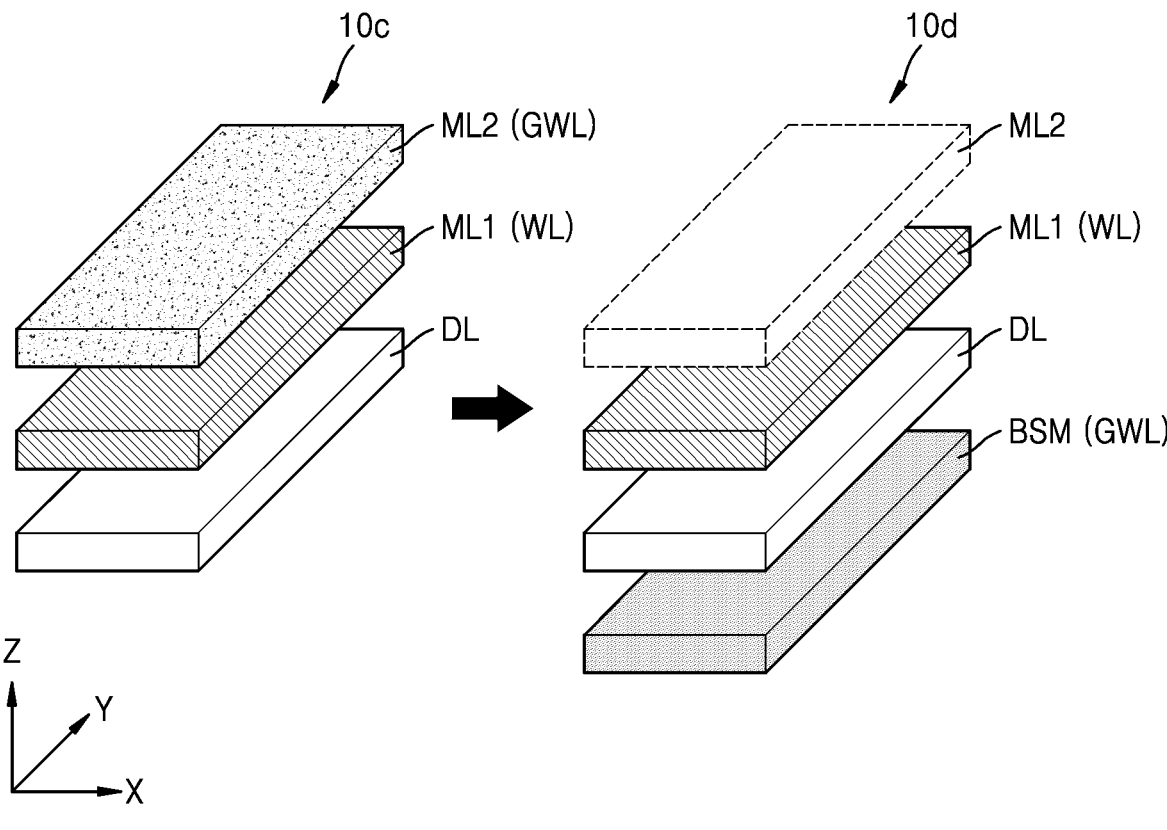
FIG. 4 illustrates a wiring structure of an integrated circuit according to a Comparative Example and a wiring structure of an integrated circuit according to an example embodiment.

FIG. 4 illustrates a wiring structure of an IC 10c according to a comparative example and a wiring structure of an IC 10d according to an embodiment.

Referring to FIG. 4, in the IC 10c according to the comparative example, the word lines WL and the global word lines GWL may be disposed above the device layer DL. In detail, bit cells may be disposed on the device layer DL, and first and second wiring layers ML1 and ML2 may be disposed above the device layer DL. Here, local word lines or word lines WL may be located on the first wiring layer ML1, and the global word lines GWL may be located on the second wiring layer ML2. In this case, as the number of bit cells increases, routing complexity of the first and second wiring layers ML1 and ML2 may further increase.

However, in the IC 10d according to an embodiment, the word lines WL may be disposed above the device layer DL, and the global word lines GWL may be disposed below the device layer DL. Here, the local word lines or the word lines WL may be disposed above the frontside side of the device layer DL, for example, on the first wiring layer ML1, and the global word lines GWL may be disposed on the rear side of the device layer DL, for example, above the backside wiring layer BSM. In this case, wirings for transferring other signals and/or power may be arranged on the second wiring layer ML2, and thus, the routing freedom of the frontside wiring layers including the second wiring layer ML2 may increase. In addition, despite the increase in bit cells, the routing complexity of the first and second wiring layers ML1 and ML2 may not increase.

Figure 5:
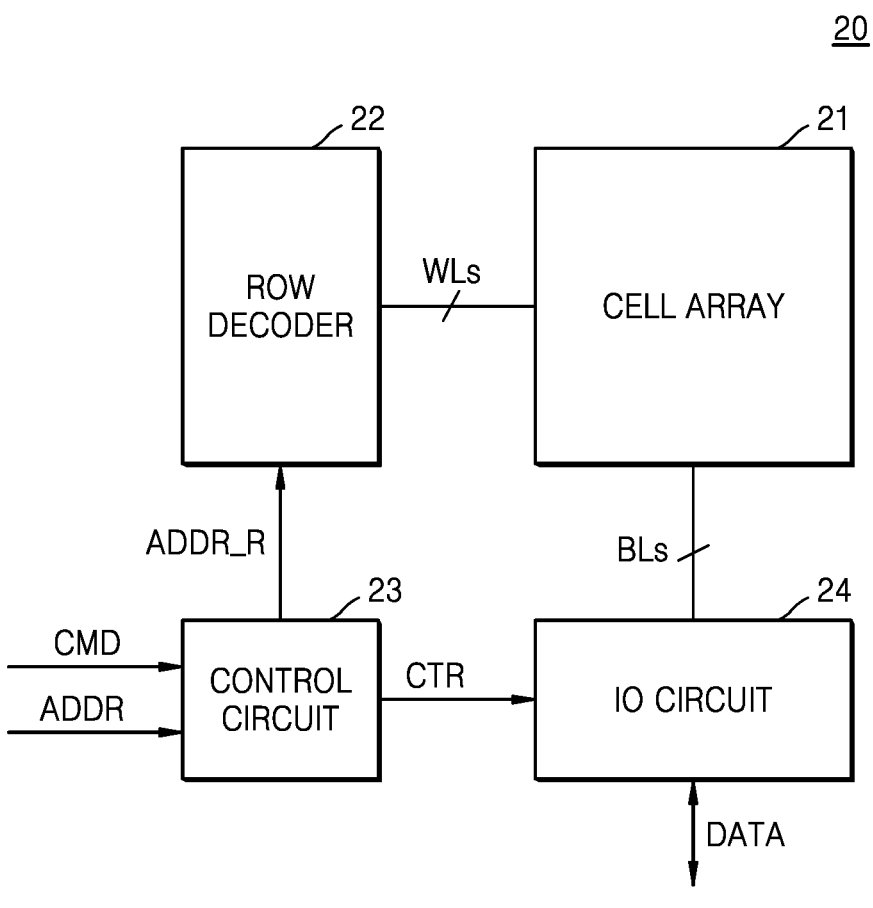
FIG. 5 is a block diagram illustrating a memory device according to an embodiment.

FIG. 5 is a block diagram illustrating a memory device 20 according to an embodiment.

Referring to FIG. 5, the memory device 20 may include a cell array 21, a row decoder 22, a control circuit 23, and an I/O circuit 24. Here, the row decoder 22, the control circuit 23, and the I/O circuit 24 may be collectively referred to as peripheral circuits. According to embodiments, the peripheral circuit may further include a command buffer, an address buffer, and/or a voltage generator.

The memory device 20 may receive a command CMD, an address ADDR, and data DATA. For example, the memory device 20 may receive a command CMD instructing a write operation, an address ADDR, and data DATA and store the received data DATA in a region of the cell array 21 corresponding to the address ADDR. In addition, the memory device 20 may receive a command CMD instructing a read operation and an address ADDR and output data stored in the region of the cell array 21 corresponding to the address ADDR externally.

The cell array 21 may include a plurality of bit cells or memory cells accessed by a plurality of word lines WLs and a plurality of bit lines BLs. In some embodiments, the memory cells included in the cell array 21 may be volatile memory cells, such as static random access memory (SRAM), dynamic random access memory (DRAM), etc. In some embodiments, the memory cells included in the cell array 21 may be non-volatile memory cells, such as flash memory, resistive random access memory (RRAM), etc. Embodiments are given mainly with reference to an SRAM cell, as described below with reference to FIG. 6 and the like, but embodiments are not limited thereto.

The control circuit 23 may generate a row address ADDR_R and a control signal CTR based on the command CMD and the address ADDR. For example, the control circuit 23 may identify a read command by decoding the command CMD and generate the row address ADDR_R and the control signal CTR to read the data DATA from the cell array 21. In addition, the control circuit 23 may identify a write command by decoding the command CMD and generate a row address ADDR_R and a control signal CTR to write data DATA to the cell array 21.

The row decoder 22 may be connected to the cell array 21 through the word lines WLs and may activate one of the word lines WLs according to the row address ADDR_R. Accordingly, memory cells connected to the activated word line among the memory cells included in the cell array 21 may be selected. The row decoder 22 may include a row driver. In the present embodiment, the row decoder 22 may be understood as including a row driver.

If the length of each of the word lines WLs increases due to an increase in the number of bit cells included in the cell array 21, the word line resistance may increase, which may deteriorate the performance of the memory device 20. Therefore, according to the present embodiment, the cell array 21 may be divided into a plurality of cell arrays (e.g., the first and second cell arrays 11a and 11b of FIG. 1), and the memory device 20 may further include word line rebuffers respectively corresponding to the cell arrays.

Wirings by which the word line signals output from the row decoder 22 are received may be referred to as "global word lines," and wirings by which the word line signals output from the word line rebuffer are received may be referred to as "local word lines." Word line signals output from the row decoder 22 may be transmitted to the word line rebuffers through the global word lines, and word line signals respectively output from the word line rebuffers may be applied to corresponding bit cells through local word lines.

The I/O circuit 24 may be connected to the cell array 21 through the bit lines BLs and may perform a read operation or a write operation according to the control signal CTR. For example, the I/O circuit 24 may include a column driver. The column driver may detect current and/or voltage in the bit lines BLs or apply current and/or voltage to the bit lines BLs at a timing determined based on the control signal CTR.

Figure 6:
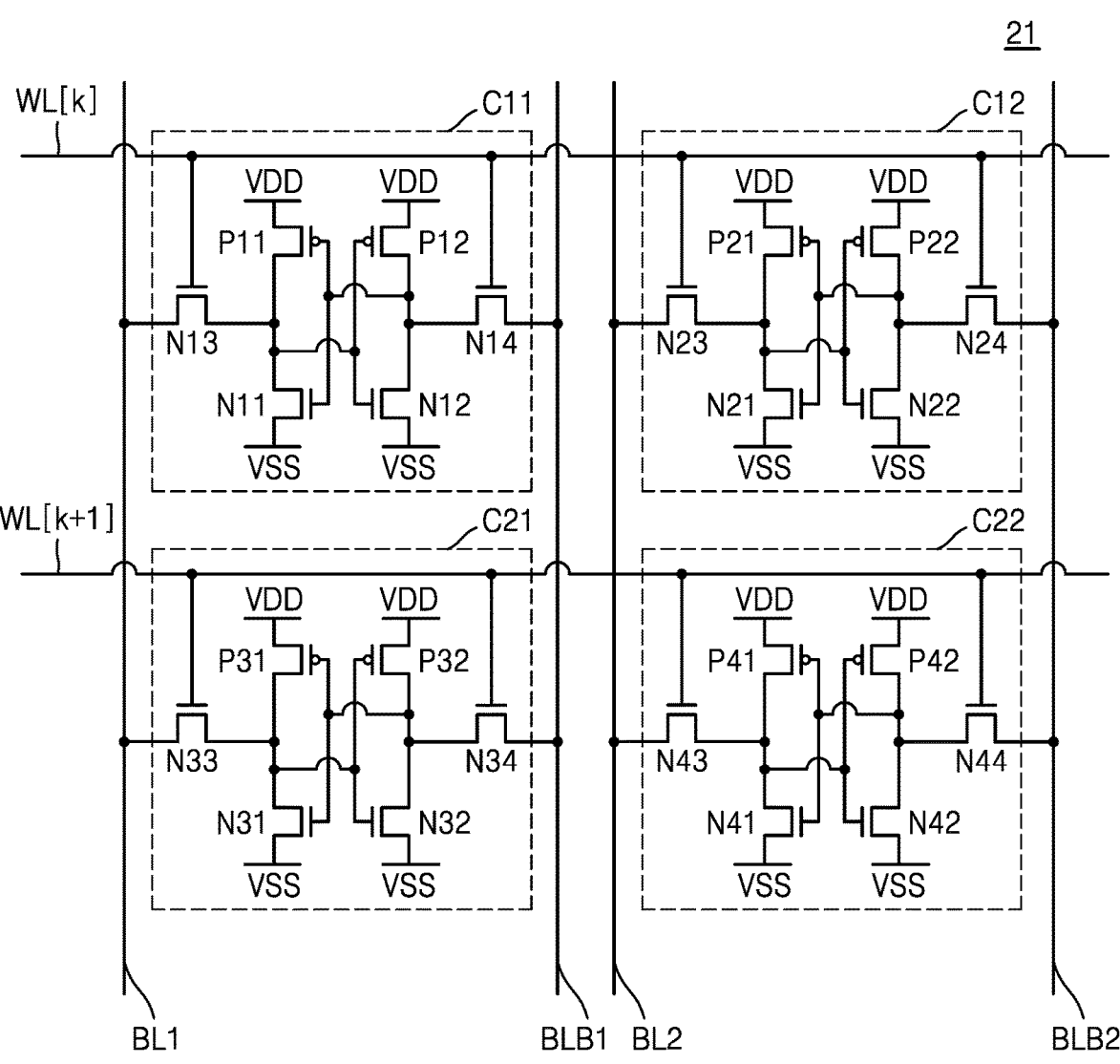
FIG. 6 is a circuit diagram illustrating a cell array according to an embodiment.

FIG. 6 is a circuit diagram illustrating the cell array 21 according to an embodiment.

Referring to FIG. 6, the cell array 21 may include memory cells C11, C12, C21, and C22 arranged to be adjacent to each other. For example, the cell array 21 may correspond to an example of the first and second cell arrays 11a and 11b of FIGS. 1 and 2 and/or the cell array 21 of FIG. 5. The memory cells C11 and C12 arranged in the same row may be commonly connected to a word line WL[k], and the memory cells C21 and C22 arranged in the same row may be commonly connected to a word line WL[k+1] (k is an integer greater than 0). In addition, the memory cells C11 and C21 arranged in the same column may be connected to a first bit line BL1 and a first complementary bit line BLB1, and the memory cells C12 and C22 arranged in the same column may be connected to a second bit line BL2 and a second complementary bit line BLB2.

The memory cell C11 may include a first P-type field-effect transistor PFET P11, a second PFET P12, first to fourth N-type field-effect transistors NFETs N11 to N14 and may be a 6T (six transistors) SRAM cell. The memory cell C11 may include a cross-coupled inverter pair between a node to which a positive supply voltage (or cell voltage) VDD is applied and a node to which a negative supply voltage (or ground voltage) VSS is applied. For example, of a cross-coupled inverter pair, a first inverter may include a first PFET P11 and a first NFET N11, and a second inverter may include a second PFET P12 and a second NFET N12. In addition, a third NFET N13 and a fourth NFET N14 may be referred to as transmission transistors or pass transistors configured to respectively connect the first inverter and the second inverter to the first bit line BL1 and the first complementary bit line BLB1 by an activated word line WL[k] (for example, having a high level voltage). As shown in FIG. 6, the memory cells C12, C21, and C22 may have the same structure corresponding to the memory cell C11. Accordingly, the description of the memory cell C11 may be applied to the memory cells C12, C21, and C22.

The memory cell C12 may include a first PFET P21, a second PFET P22, and first to fourth NFETs N21 to N24. The third NFET N23 and the fourth NFET N24 may be configured to respectively connect a first inverter including a first PFET P31 and a first NFET N31 and a second inverter including a second PFET P32 and a second NFET N32 to the first bit line BL1 and the first complementary bit line BLB1 by the activated word line WL[k].

The memory cell C21 may include a first PFET P31, a second PFET P32, and first to fourth NFETs N31 to N34. The third NFET N33 and the fourth NFET N34 may be configured to respectively connect a first inverter including a first PFET P31 and a first NFET N31 and a second inverter including a second PFET P32 and a second NFET N32 to the first bit line BL1 and the first complementary bit line BLB1 by an activated word line WL[k+1].

The memory cell C22 may include a first PFET P41, a second PFET P42, and first to fourth NFETs N41 to N44. The third NFET N43 and the fourth NFET N44 may be configured to respectively connect a first inverter including the first PFET P41 and the first NFET N41 and a second inverter including the second PFET P42 and the second NFET N42 to the second bit line BL2 and the second complementary bit line BLB2 by the activated word line WL[k+1].

FIG. 7 is a perspective view illustrating an IC 30 according to an embodiment.

Referring to FIG. 7, the IC 30 may correspond to a modified example of the IC 10 of FIG. 1. The IC 30 may include a row decoder 33 and the row decoder 33 may be connected to cell arrays on both sides of the row decoder 33. Accordingly, the row decoder 33 may be referred to as a "center row decoder." The description given above with reference to FIGS. 1 to 6 may also be applied to the present embodiment.

The IC 30 may further include a plurality of cell arrays including first and second cell arrays 31a and 31b connected to one side of the row decoder 33 and third and fourth cell arrays 31c and 31d connected to the other side of the row decoder 33. The IC 30 may further include a plurality of word line rebuffers including first and second word line rebuffers 32a and 32b arranged on one side of the row decoder 33, third and fourth word line rebuffers 32c and 32d arranged on the other side of the row decoder 33.

The row decoder 33 may provide word line signals for driving the first to fourth cell arrays 31a, 31b, 31c, and 31d. For example, the first word line rebuffer 32a may be located between the row decoder 33 and the first cell array 31a, and the second word line rebuffer 32b may be located between the first cell array 31a and the second cell array 31b. For example, the third word line rebuffer 32c may be located between the row decoder 33 and the third cell array 31c, and the fourth word line rebuffer 32d may be located between the third cell array 31c and the fourth cell array 31d.

The IC 30 may further include the frontside wiring layer FSM disposed above the substrate in the vertical direction Z with respect to the first side of the substrate, for example, the front side of the substrate. The frontside wiring layer FSM may include first to fourth local word lines 34a, 34b, 34c, and 34d and first and second frontside global word lines 34e and 34f. The first local word lines 34a may be disposed above the first cell array 31a in the vertical direction Z and may be connected to first bit cells included in the first cell array 31a. The second local word lines 34b may be disposed above the second cell array 31b in the vertical direction Z and may be connected to second bit cells included in the second cell array 31b. The third local word lines 34c may be disposed above the third cell array 31c in the vertical direction Z and may be connected to third bit cells included in the third cell array 31c. The fourth local word lines 34d are disposed above the fourth cell array 31d in the vertical direction Z and may be connected to fourth bit cells included in the fourth cell array 31d.

The first frontside global word lines 34e may be located between the row decoder 33 and the first word line rebuffer 32a and may respectively receive first word line signals from the row decoder 33. The first local word lines 34a may respectively receive first word line signals or buffered first word line signals from the first word line rebuffer 32a. The second local word lines 34b may respectively receive first word line signals or buffered first word line signals from the second word line rebuffer 32b.

The second frontside global word lines 34f may be located between the row decoder 33 and the third word line rebuffer 32c and may respectively receive second word line signals from the row decoder 33. The third local word lines 34c may respectively receive second word line signals or buffered second word line signals from the third word line rebuffer 32c. The fourth local word lines 34d may respectively receive second word line signals or buffered second word line signals from the fourth word line rebuffer 32d.

For example, the first to fourth local word lines 34a, 34b, 34c, and 34d may each extend in the first direction X. For example, the first and second frontside global word lines 34e and 34f may each extend in the first direction X. In FIG. 7, the first to fourth local word lines 34a, 34b, 34c, and 34d and the first and second frontside global word lines 34e and 34f are shown as being arranged at the same level, but embodiments of the disclosure are not limited thereto.

The IC 30 may further include a backside wiring layer BSM including first and second backside wiring lines 35a and 35b disposed on the second side of the substrate, for example, the backside of the substrate. The first backside wiring lines 35a may receive first word line signals from the row decoder 33 and may thus respectively correspond to "first backside global word lines." The second backside wiring lines 35b may receive second word line signals from the row decoder 33 and may thus respectively correspond to "second backside global word lines." The first and second backside wiring lines 35a and 35b may each extend in the first direction X. However, embodiments of the disclosure are not limited thereto, and the extension direction of the first and second backside wiring lines 35a and 35b may vary according to embodiments.

The IC 30 may further include backside vias BVA respectively disposed on the first and second backside wiring lines 35a and 35b and extending in the vertical direction Z. The backside vias BVA may pass through the substrate in the vertical direction Z and, accordingly, may be referred to as "through-vias." The backside vias BVA may include first to fourth backside vias 36a, 36b, 36c, and 36d. The first backside vias 36a may be connected between the row decoder 33 and the first backside wiring lines 35a. For example, the first backside vias 36a may be connected between the first frontside global word lines 34e and the first backside wiring lines 35a, respectively. The second backside vias 36b may be respectively connected between the first backside wiring lines 35a and the second word line rebuffer 32b. The third backside vias 36c may be connected between the row decoder 33 and the second backside wiring lines 35b. For example, the third backside vias 36c may be respectively connected between the second frontside global word lines 34f and the second backside wiring lines 35b. The fourth backside vias 36d may be respectively connected between the second backside wiring lines 35b and the fourth word line rebuffer 32d.

According to the present embodiment, the first backside wiring lines 35a may respectively receive first word line signals from the row decoder 33 through the first frontside global word lines 34e and the first backside vias 36a and transfer the first word line signals to the second word line rebuffer 32b through the second backside vias 36b. The first word line rebuffer 32a may receive first word line signals from the first frontside global word lines 34e and provide the received first word line signals to the first local word lines 34a, respectively. The second word line rebuffer 32b may receive first word line signals from the first backside global word lines, that is, the first backside wiring lines 35a, and provide the received first word line signals to the second local word lines 34b, respectively.

In addition, the second backside wiring lines 35b may respectively receive second word line signals from the row decoder 33 through the second frontside global word lines 34f and the third backside vias 36c and transmit second word line signals to the fourth word line rebuffer 32d through the fourth backside vias 36d. The third word line rebuffer 32c may respectively receive second word line signals from the second frontside global word lines 34f and provide the received second word line signals to the third local word lines 34c. The fourth word line rebuffer 32d may receive second word line signals from the second backside global word lines, that is, the second backside wiring lines 35b, and provide the received second word line signals to the fourth local word lines 34d, respectively.

Figure 8:
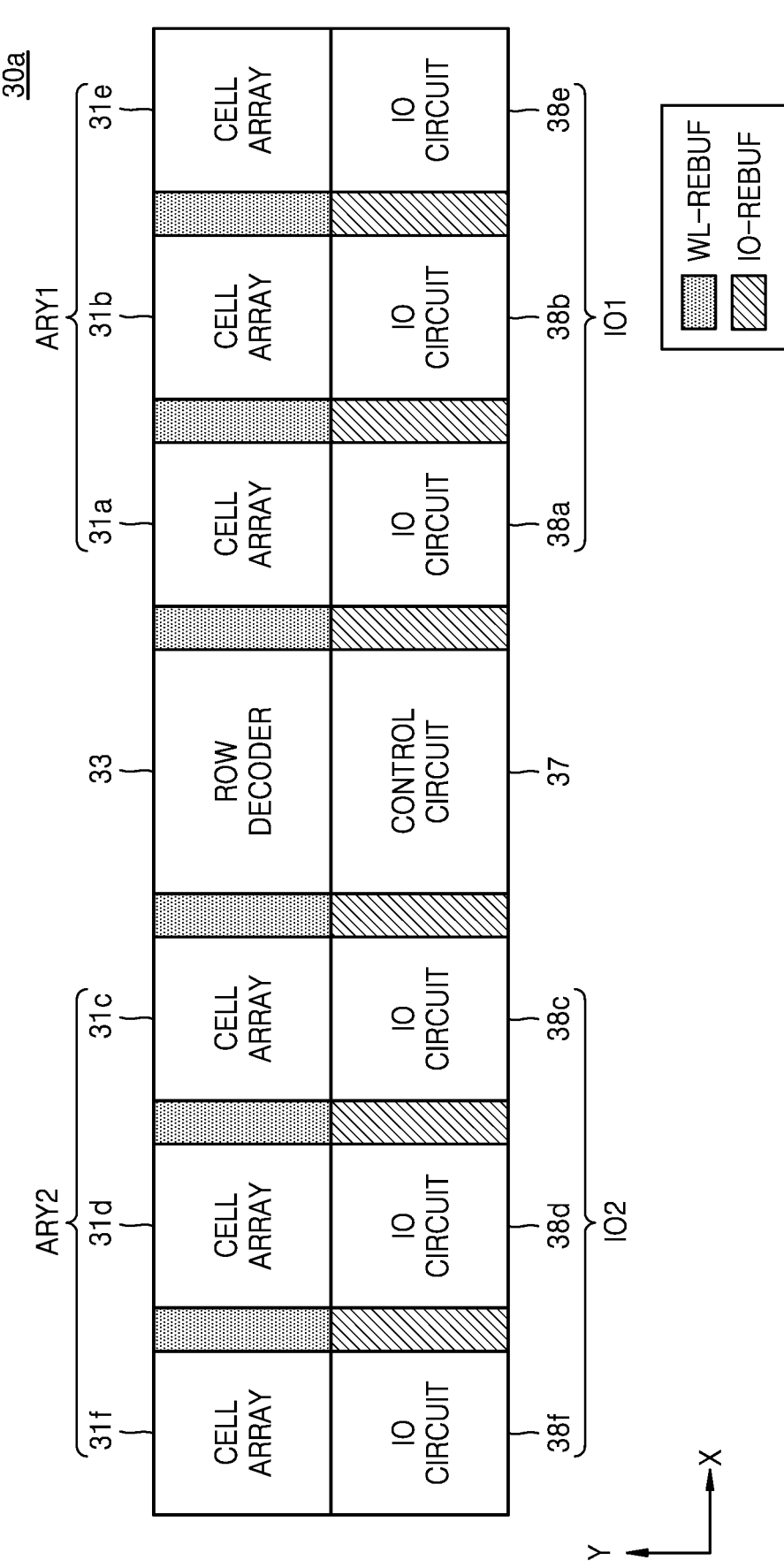
FIG. 8 is a plan view illustrating an integrated circuit according to an embodiment.

FIG. 8 is a plan view illustrating an IC 30a according to an embodiment.

Referring to FIG. 8, the IC 30a may include first and second cell array groups ARY1 and ARY2, a row decoder 33, a control circuit 37, and first and second I/O circuit groups IO1 and IO2. The IC 30a may correspond to a modified example of the IC 30 of FIG. 7. The control circuit 37 may be located to be adjacent to the row decoder 33 in the second direction Y, and the first I/O circuit group IO1 may be located on one side of the control circuit 37 and the second I/O circuit group IO2 may be located on the other side of the control circuit 37.

The first cell array group ARY1 may be connected to the first I/O circuit group IO1, and the second cell array group ARY2 may be connected to the second I/O circuit group IO2. In detail, the first cell array group ARY1 may include cell arrays 31a, 31b, and 31e, and the first I/O circuit group IO1 may include I/O circuits 38a, 38b, and 38e. The second cell array group ARY2 may include cell arrays 31c, 31d, and 31f, and the second I/O circuit group IO2 may include I/O circuits 38c, 38d, and 38f.

The IC 30a may further include a plurality of word line rebuffers WL-REBUF respectively corresponding to the cell arrays 31a to 31f. For example, the word line rebuffer WL-REBUF located between the row decoder 33 and the cell array 31a may correspond to the first word line rebuffer 32a of FIG. 7. For example, the word line rebuffer WL-REBUF located between the row decoder 33 and the cell array 31c may correspond to the third word line rebuffer 32c of FIG. 7. In an embodiment, the wirings between the row decoder 33 and the word line rebuffers WL-REBUF, for example, the global word lines, may be implemented using backside wiring lines (for example, 35a and 35b of FIG. 7) disposed on a backside of the substrate.

The IC 30a may further include a plurality of I/O rebuffers IO-REBUF respectively corresponding to the I/O circuits 38a to 38f. The I/O buffers IO-REBUF may receive a control signal (e.g., CTR in FIG. 5) from the control circuit 37, buffer the received control signal CTR, and provide the buffered control signal to the corresponding I/O circuits 38a to 38f, respectively. In an embodiment, wirings between the control circuit 37 and the I/O rebuffers IO-REBUF may be implemented using backside wiring lines disposed on the backside of the substrate.

Figure 9:
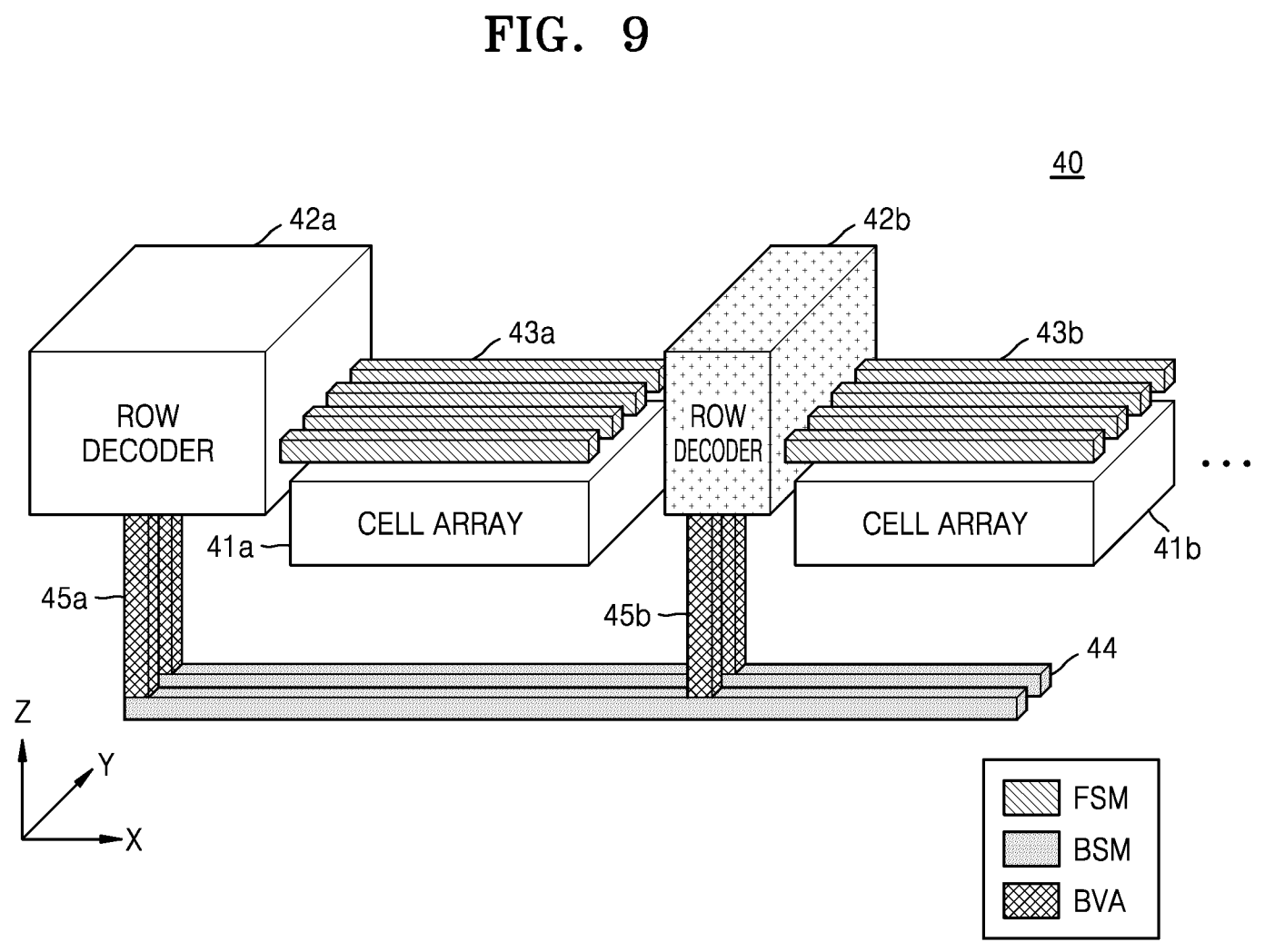

FIG. 9 is a perspective view illustrating an IC 40 according to an embodiment.

Referring to FIG. 9, the IC 40 may include a plurality of cell arrays including a first cell array 41a and a second cell array 41b. Each of the plurality of cell arrays may include a plurality of bit cells or memory cells. For example, the first cell array 41a may include first bit cells and the second cell array 41b may include second bit cells. For example, the first and second cell arrays 41a and 41b may be arranged in the first direction X, but embodiments are not limited thereto.

The IC 40 may further include a plurality of row decoders including a first row decoder 42a and a second row decoder 42b. In this specification, it may be understood that each of the first and second row decoders 42a and 42b includes a row driver. According to embodiments, the first row decoder 42a may be referred to as a "main row decoder" and the second row decoder 42b may be referred to as a "sub-row decoder." The first and second cell arrays 41a and 41b and the first and second row decoders 42a and 42b may be arranged on the substrate. In this manner, the substrate on which the first and second cell arrays 41a and 41b and the first and second row decoders 42a and 42b are arranged may be defined as a "device layer." For example, the device layer may correspond to the device layer DL in FIG. 4. For example, the second row decoder 42b may be located between the first cell array 41a and the second cell array 41b.

The IC 40 may further include the frontside wiring layer FSM disposed above the substrate in the vertical direction Z with respect to the first side of the substrate, for example, the front side of the substrate. The frontside wiring layer FSM may include first and second local word lines 43a and 43b. The first local word lines 43a may be arranged above the first cell array 41a in the vertical direction Z and may be connected to first bit cells included in the first cell array 41a. The second local word lines 43b may be arranged above the second cell array 41b in the vertical direction Z and may be connected to second bit cells included in the second cell array 41b. For example, the first local word lines 43a may each extend in the first direction X and be apart from each other in the second direction Y. For example, the second local word lines 43b may each extend in the first direction X and be apart from each other in the second direction Y.

The IC 40 may further include the backside wiring layer BSM including backside wiring lines 44 arranged on the second side of the substrate, for example, the backside of the substrate. The backside wiring lines 44 may receive a row address from the first row decoder 42a. The backside wiring lines 44 may each extend in the first direction X and be apart from each other in the second direction Y. However, embodiments of the disclosure are not limited thereto, and the extension direction of the backside wiring lines 44 may vary according to embodiments.

The IC 40 may further include the backside vias BVA respectively arranged on the backside wiring lines 44 and extending in the vertical direction Z. The backside vias BVA may pass through the substrate in the vertical direction Z and, accordingly, may be referred to as "through-vias." The backside vias BVA may include first backside vias 45a and second backside vias 45b. The first backside vias 45a may be connected between the first row decoder 42a and the backside wiring lines 44. The second backside vias 45b may be respectively connected between the backside wiring lines 44 and the second row decoder 42b.

In the present embodiment, the pitch of the backside wiring lines 44 may be greater than the pitch of the first local word lines 43a and the pitch of the second local word lines 43b. Accordingly, the number of backside wiring lines 44 overlapping the first local word lines 43a in the vertical direction Z may be less than the number of first local word lines 43a. Similarly, the number of backside wiring lines 44 overlapping the second local word lines 43b in the vertical direction Z may be less than the number of second local word lines 43b. For example, the number of backside wiring lines 44 overlapping in the vertical direction Z with respect to the four first local word lines 43a may be two.

In this manner, when the pitch of the backside wiring lines 44 included in the backside wiring layer BSM is greater than the pitch of the first or second local word lines 43a and 43b included in the frontside wiring layer FSM, the second row decoder 42b may be located between the first and second cell arrays 41a and 41b, instead of the word line rebuffer. In this case, the backside wiring lines 44 may transmit address signals, instead of word line signals.

In detail, the first row decoder 42a may provide first word line signals for driving the first cell array 41a by decoding the row address. For example, the first row decoder 42a may receive a row address (e.g., ADDR_R in FIG. 5) from a control circuit and generate first word line signals from the received row address. For example, when the row address is a 2-bit signal, the first row decoder 42*a* may decode the 2-bit row address to generate 4-bit first word line signals.

In addition, the first row decoder 42*a* may transmit the received row address externally or buffer the received row address. For example, the first row decoder 42*a* may include a transmission gate, and when the first row decoder 42*a* receives the first row address, the first row address may pass through the transmission gate and be output as a second row address. Here, the second row address may correspond to the first row address. For example, the first row decoder 42*a* may include a buffer, and the received row address may pass through the buffer and be output as a buffered row address.

According to the present embodiment, the backside wiring lines 44 may receive a row address from the first row decoder 42*a* through the first backside vias 45*a* and transmit the row address to the second row decoder 42*b* through the second backside vias 45*b*. The second row decoder 42*b* may decode the row address received from the backside wiring lines 44 through the second backside vias 45*b*, thereby generating second word line signals for driving the second cell array 41*b*. Here, the second word line signals may correspond to the first word line signals.

The first local word lines 43*a* may receive first word line signals from the first row decoder 42*a* and may be connected to the first bit cells included in the first cell array 41*a* according to the received first word line signal. In addition, the second local word lines 43*b* may receive second word line signals from the second row decoder 42*b* and may be connected to the second bit cells included in the second cell array 41*b* according to the received second word line signal.

Figure 10:
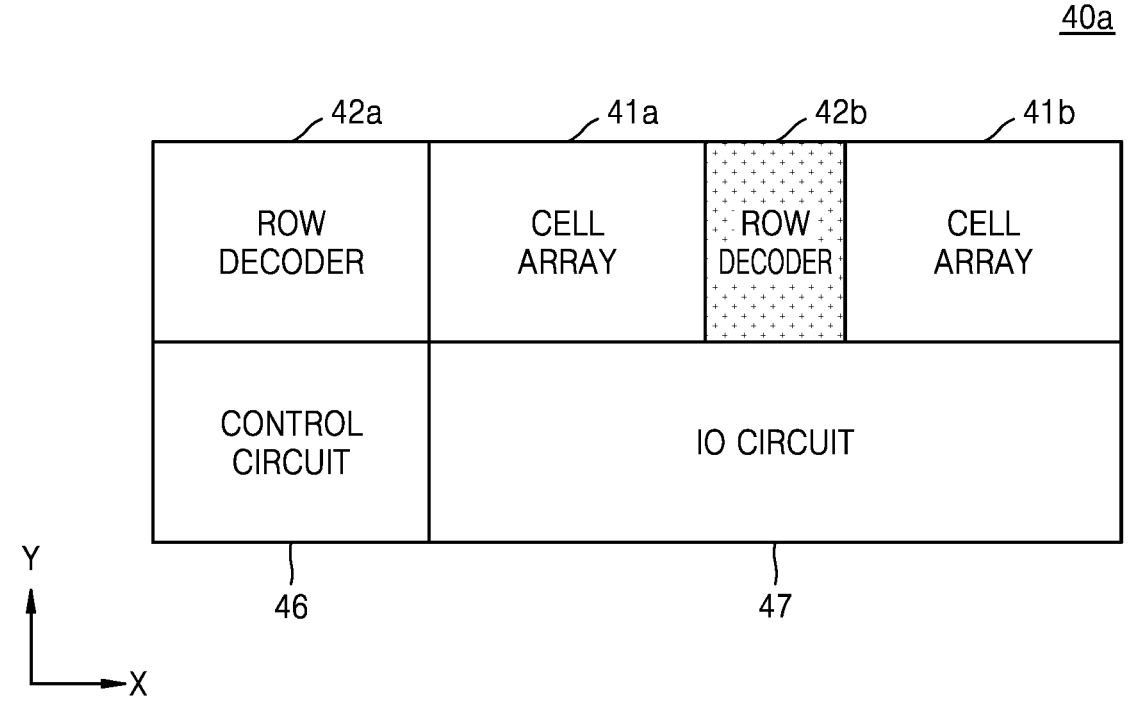
FIG. 10 is a plan view illustrating an integrated circuit according to an embodiment.

FIG. 10 is a plan view illustrating an IC 40*a* according to an embodiment.

Figure 11:
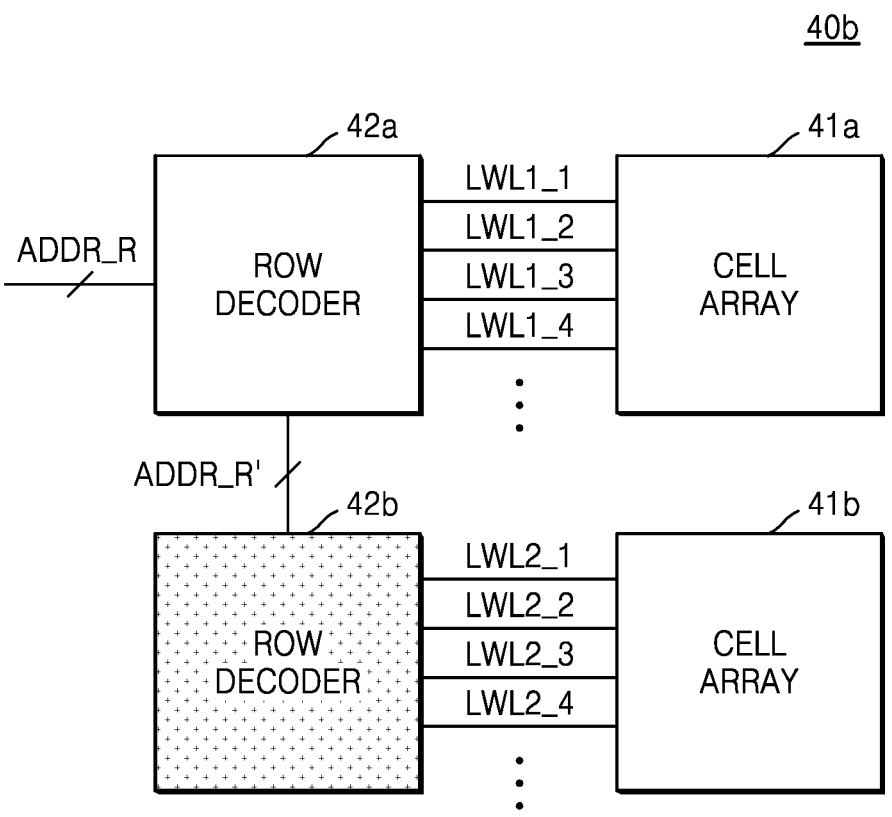
FIG. 11 illustrates a connection relationship of an integrated circuit according to an embodiment.

Referring to FIG. 10, the IC 40*a* may include first and second cell arrays 41*a* and 41*b*, first and second row decoders 42*a* and 42*b*, a control circuit 46, and an I/O circuit 47. The IC 40*a* may correspond to a modified example of the IC 40 of FIG. 9. The first row decoder 42*a* may be located to be adjacent to the control circuit 46 in the second direction Y. The second row decoder 42*b* may be located between the first cell array 41*a* and the second cell array 41*b*. The I/O circuit 47 may be located to be adjacent to the control circuit 46 in the first direction X. FIG. 11 illustrates a connection relationship of an IC 40*b* according to an embodiment.

Referring to FIG. 11, the IC 40*b* may correspond to a modified example of the IC 40 of FIG. 9 and the IC 40*a* of FIG. 10. The first row decoder 42*a* may be connected to the first cell array 41*a* through first local word lines LWL1_1 to LWL1_4. The second row decoder 42*b* may be connected to the second cell array 41*b* through second local word lines LWL2_1 to LWL2_4.

The first row decoder 42*a* may receive the row address ADDR_R and decode the received row address ADDR_R to generate first word line signals for driving the first cell array 41*a*. In addition, the first row decoder 42*a* transmits or buffers the received row address ADDR_R to generate a row address ADDR_R'. The second row decoder 42*b* may receive the row address ADDR_R' and decode the received row address ADDR_R' to generate second word line signals for driving the second cell array 41*b*.

Referring to FIGS. 9 and 11 together, the row address ADDR_R' may be transmitted using the backside wiring layer BSM, and the first local word lines LWL1_1 to LWL1_4 and the second local word lines LWL2_1 to LWL2_4 may be implemented using the frontside wiring layer FSM. For example, the row address ADDR_R' may be transmitted through the first backside vias 45*a*, the backside wiring lines 44, and the second backside vias 45*b*. For example, the first local word lines LWL1_1 to LWL1_4 may be implemented as first local word lines 43*a*. For example, the second local word lines LWL2_1 to LWL2_4 may be implemented as second local word lines 43*b*.

Figure 12:
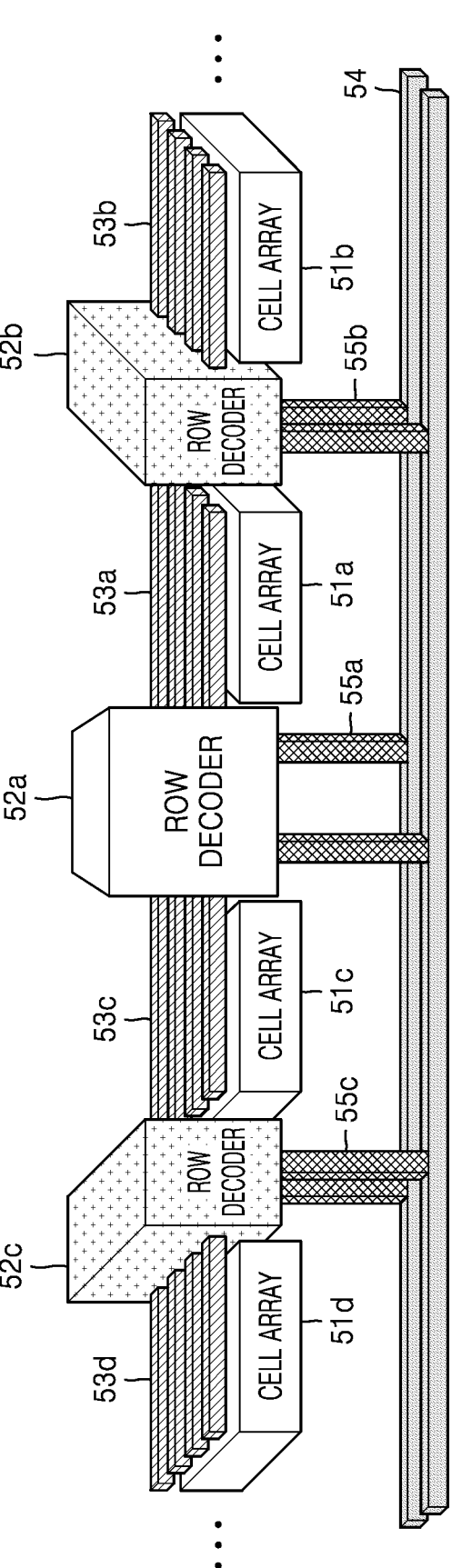
FIG. 12 is a perspective view illustrating an integrated circuit according to an embodiment.
Figure 12:
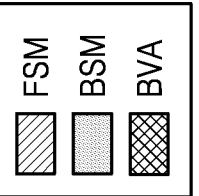

FIG. 12 is a perspective view illustrating an IC 50 according to an embodiment.

Referring to FIG. 12, the IC 50 may correspond to a modified example of the IC 40 of FIG. 9. The IC 50 may include a first row decoder 52*a* and the first row decoder 52*a* may be connected to cell arrays on both sides of the first row decoder 52*a*. Accordingly, the first row decoder 52*a* may be referred to as a "central row decoder." The description given above with reference to FIGS. 9 to 11 may also be applied to the present embodiment.

The IC 50 may further include a plurality of cell arrays including first and second cell arrays 51*a* and 51*b* connected to one side of the first row decoder 52*a* and third and fourth cell arrays 51*c* and 51*d* connected to the other side of the first row decoder 52*a* . . . . The IC 50 may further include a plurality of row decoders including a second row decoder 52*b* disposed on one side of the first row decoder 52*a* and a third row decoder 52*c* disposed on the other side of the first row decoder 52*a*. For example, the second row decoder 52*b* may be located between the first cell array 51*a* and the second cell array 51*b*. For example, the third row decoder 52*c* may be located between the third cell array 51*c* and the fourth cell array 51*d*.

The first row decoder 52*a* may provide first word line signals for driving the first cell array 51*a* and third word line signals for driving the third cell array 51*c*. The second row decoder 52*b* may provide second word line signals for driving the second cell array 51*b*. The third row decoder 52*c* may provide fourth word line signals for driving the fourth cell array 51*d*.

The IC 50 may further include the frontside wiring layer FSM disposed above the substrate in the vertical direction Z with respect to the first side of the substrate, for example, the front side of the substrate. The frontside wiring layer FSM may include first to fourth local word lines 53*a*, 53*b*, 53*c*, and 53*d*. The first local word lines 53*a* may be disposed above the first cell array 51*a* in the vertical direction Z and may be connected to first bit cells included in the first cell array 51*a*. The second local word lines 53*b* may be disposed above the second cell array 51*b* in the vertical direction Z and may be connected to second bit cells included in the second cell array 51*b*. The third local word lines 53*c* may be disposed above the third cell array 51*c* in the vertical direction Z and may be connected to third bit cells included in the third cell array 51*c*. The fourth local word lines 53*d* may be disposed above the fourth cell array 51*d* in the vertical direction Z and may be connected to fourth bit cells included in the fourth cell array 51*d*.

The IC 50 may further include the backside wiring layer BSM including backside wiring lines 54 disposed on the second side of the substrate, for example, the backside of the substrate. The backside wiring lines 54 may receive a row address (e.g., ADDR_R' in FIG. 11) from the first row decoder 52*a*, and thus may respectively correspond to "backside row address lines." The backside wiring lines 54 may each extend in the first direction X. However, embodiments of the disclosure are not limited thereto, and the extension direction of the backside wiring lines 54 may vary according to embodiments.

The IC 50 may further include backside vias BVA respectively disposed on the backside wiring lines 54 and extending in the vertical direction Z. The backside vias BVA may pass through the substrate in the vertical direction Z and, accordingly, may be referred to as "through-vias." The backside vias BVA may include first to third backside vias 55a, 55b, and 55c. The first backside vias 55a may be connected between the first row decoder 52a and the backside wiring lines 54. The second backside vias 55b may be respectively connected between the backside wiring lines 54 and the second row decoder 52b. The third backside vias 55c may be respectively connected between the backside wiring lines 54 and the third row decoder 52c.

According to the present embodiment, the backside wiring lines 54 may receive a row address from the first row decoder 52a through the first backside vias 55a, transmit a row address to the second row decoder 52b through the second backside vias 55b, and transmit the row address to the third row decoder 52c through the third backside vias 55c.

The first local word lines 53a may receive first word line signals from the first row decoder 52a and be connected to first bit cells according to the received first word line signals. The second row decoder 52b may receive a row address from the first row decoder 52a through the first backside vias 55a, the backside wiring lines 54, and the second backside vias 55b and generate second word line signals according to the received row address. The second local word lines 53b may receive second word line signals from the second row decoder 52b and be connected to second bit cells according to the received second word line signals.

The third local word lines 53c may receive third word line signals from the first row decoder 52a and be connected to third bit cells according to the received third word line signals. The third row decoder 52c may receive the row address from the first row decoder 52a through the first backside vias 55a, backside wiring lines 54 and the third backside vias 55c, and generate fourth word line signals according to the received row address. The fourth local word lines 53d may receive fourth word line signals from the third row decoder 52c and be connected to fourth bit cells according to the received fourth word line signals.

Figure 13:
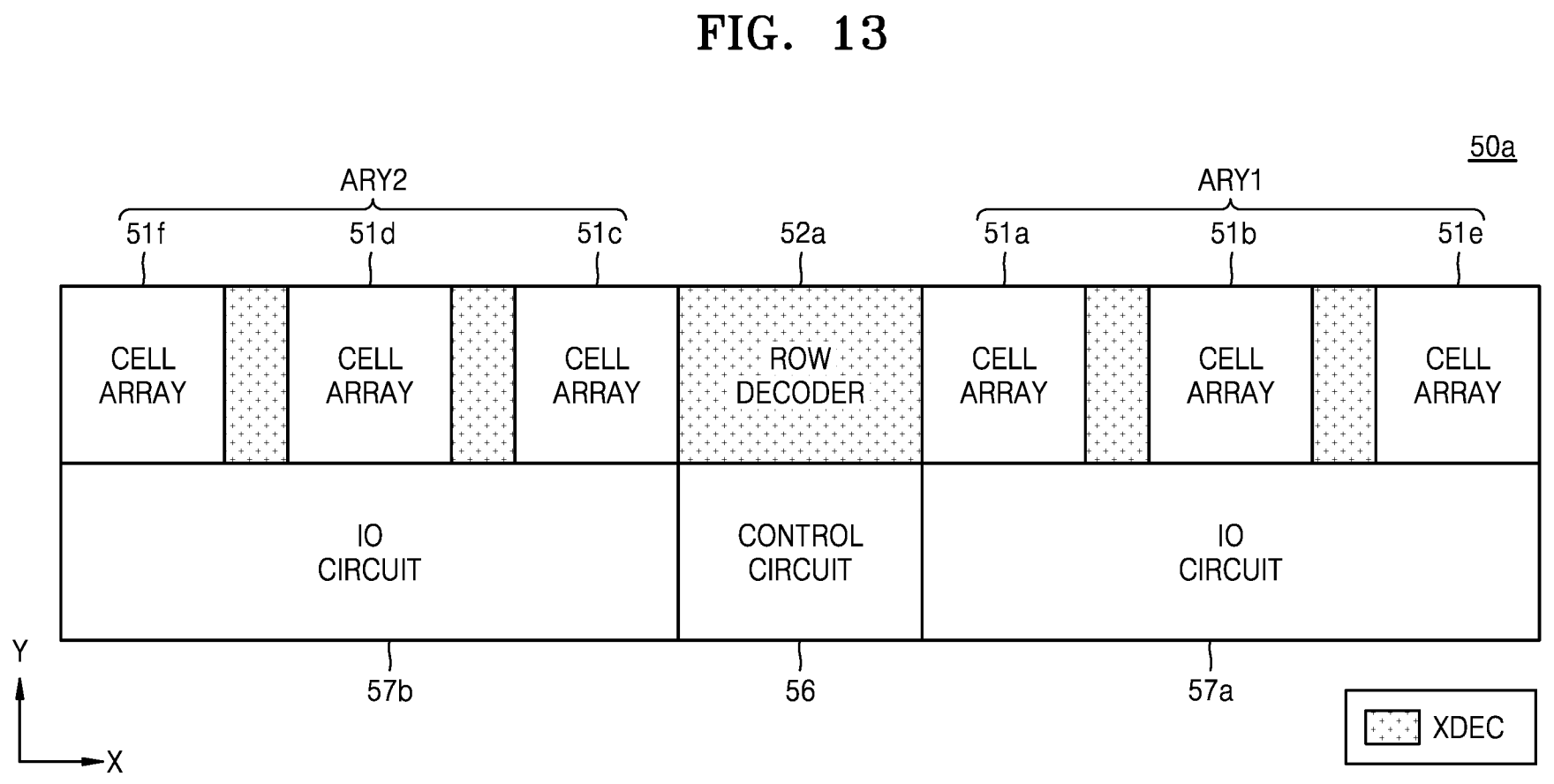

FIG. 13 is a plan view illustrating an IC 50a according to an embodiment.

Referring to FIG. 13, the IC 50a may include first and second cell array groups ARY1 and ARY2, a first row decoder 52a, a control circuit 56, and first and second I/O circuits 57a and 57b. The IC 50a may correspond to a modified example of the IC 50 of FIG. 12. The control circuit 56 may be located to be adjacent to the first row decoder 52a in the second direction Y, and the first I/O circuit 57a may be disposed on one side of the control circuit 56, and the second I/O circuit 57b may be disposed on the other side of the control circuit 56. The first cell array group ARY1 may be connected to the first I/O circuit 57a, and the second cell array group ARY2 may be connected to the second I/O circuit 57b.

The first cell array group ARY1 may include cell arrays 51a, 51b, and 51e, and row decoders XDEC may be located between the cell arrays 51a, 51b, and 51e. The second cell array group ARY2 may include cell arrays 51c, 51d, and 51f, and row decoders XDEC may be located between the cell arrays 51c, 51d, and 51f. For example, the row decoder XDEC located between the cell arrays 51a and 51b may correspond to the second row decoder 52b of FIG. 12. For example, the row decoder XDEC located between the cell arrays 51c and 51d may correspond to the third row decoder 52c of FIG. 12.

Figure 14:
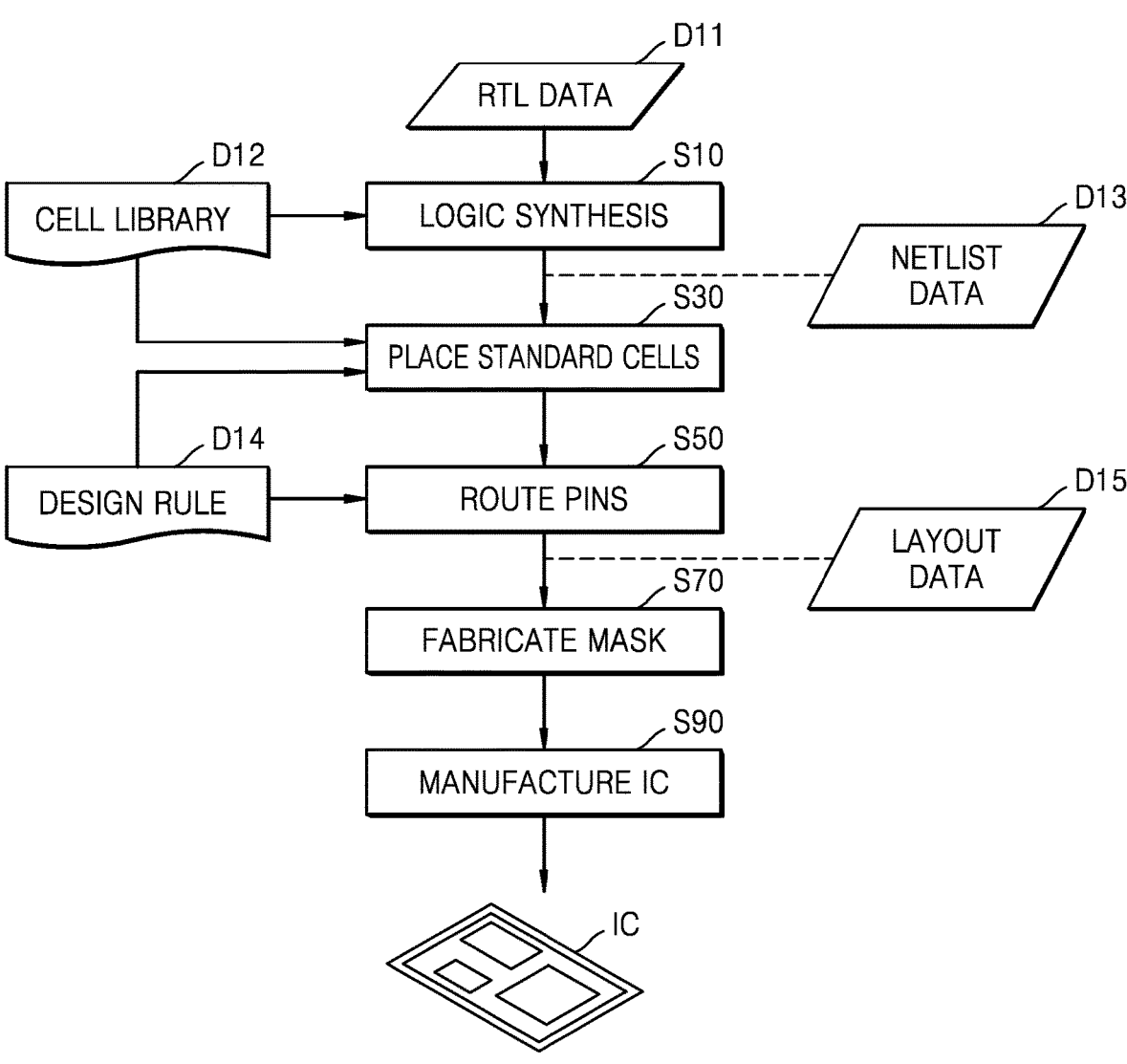
FIG. 14 is a flowchart illustrating a method of manufacturing an integrated circuit, according to an embodiment.

FIG. 14 is a flowchart illustrating a method of manufacturing an IC, according to an embodiment. Referring to FIG.

14, the method according to the present embodiment may be a method of manufacturing an IC including standard cells and may include a plurality of operations (S10, S30, S50, S70, and S90). A cell library (or a standard cell library) D12 may include information on standard cells, such as information on functions, characteristics, layout, etc. In some embodiments, the cell library D12 may define tap cells and dummy cells as well as functional cells that generate an output signal from an input signal. In some embodiments, the cell library D12 may define memory cells and dummy cells having the same footprint. A design rule D14 may include requirements that the layout of an IC complies with. For example, the design rule D14 may include requirements for a space between patterns in the same layer, the minimum width of the pattern, a routing direction of the wiring layer, etc. In some embodiments, the design rule D14 may define the minimum separation distance within the same track of the wiring layer.

In operation S10, a logical synthesis operation may be performed to generate netlist data D13 from RTL data D11. For example, a semiconductor design tool (e.g., a logic synthesis tool) may perform logic synthesis with reference to the cell library D12 from the RTL data D11 written in a hardware description language (HDL), such as VHSIC hardware description language (VHDL) and Verilog, and may generate netlist data D13 including a bitstream or netlist. The netlist data D13 may correspond to input of place and routing, which is described below.

In operation S30, standard cells may be placed. For example, a semiconductor design tool (e.g., a P&R tool) may place standard cells used in the netlist data D13 with reference to the cell library D12. In some embodiments, a semiconductor design tool may place standard cells in a row extending in the X-axis direction or the Y-axis direction, and the placed standard cells may receive power from a power rail extending in the row boundaries.

In an embodiment, as illustrated in FIGS. 1 to 8, the memory cell array may be divided into a plurality of cell arrays, and a plurality of word line rebuffers may be located respectively corresponding to the cell arrays. In addition, local word lines respectively corresponding to the cell arrays may be located on the frontside wiring layer, and global word lines corresponding to the memory cell array may be located on the backside wiring layer. Accordingly, word line resistance and capacitance may be reduced, and attenuation of the word line signal may be reduced. In addition, the routing freedom of the frontside wiring layer may be improved.

In an embodiment, as illustrated in FIGS. 9 to 13, the memory cell array may be divided into a plurality of cell arrays, and a sub-row decoder may be located between adjacent cell arrays. In addition, local word lines respectively corresponding to the cell arrays may be located on the frontside wiring layer, and an address signal line for transmitting an address signal to the sub-row decoder may be located on the backside wiring layer. Accordingly, word line resistance and capacitance may be reduced, and attenuation of the word line signal may be reduced. In addition, the routing freedom of the frontside wiring layer may be improved. Furthermore, even when the pitch of the wiring lines included in the backside wiring layer is greater than the pitch of the wiring lines included in the frontside wiring layer, the attenuation of the word line signal may be effectively reduced.

In operation S50, pins of standard cells may be routed. For example, a semiconductor design tool may generate interconnections that electrically connect output pins and input pins of placed standard cells, and layout data D15 defining the placed standard cells and the generated interconnections may be generated. The interconnections may include patterns of vias of a via layer and/or wiring layers. The wiring layers may include a frontside wiring layer disposed above the frontside side of the substrate and a backside wiring layer disposed on the backside of the substrate. The layout data D15 may have a format, such as GDSII, for example, and may include geometric information of cells and interconnections. The semiconductor design tool may refer to the design rule D14, while routing the pins of the cells. The layout data D15 may correspond to placement and an output of routing. Operation S50 alone, or operations S30 and S50 collectively, may be referred to as a method of designing an integrated circuit.

For example, the ICs 10, 10a, 10d of FIGS. 1 to 4, the IC 20 of FIG. 5, the ICs 30, 30a of FIGS. 7 to 8, the IC 40, 40a, 40b of FIGS. 9 to 11, the IC 50 of FIG. 12, or the IC 50a of FIG. 13 may include a backside wiring layer BM disposed on the backside of the substrate, and the backside wiring layer BM may be connected directly to a source/drain region of a standard cell located on the frontside side of the substrate via a DBC including backside vias BVA and/or backside contacts (BCA). Accordingly, the routing complexity of the frontside wiring layer disposed on the frontside of the substrate may be reduced, and IR drop between the backside wiring layer BM and the source/drain region may be reduced.

In operation S70, an operation of fabricating a mask may be performed. For example, in photolithography, optical proximity correction (OPC) to correct distortion, such as refraction, due to the characteristics of light may be applied to the layout data D15. Patterns on the mask may be defined to form patterns arranged in a plurality of layers based on OPC applied data, and at least one mask (or photomask) may be fabricated to form patterns in each of the layers. In some embodiments, the layout of the IC may be limitedly modified in operation S70, and the limited modification of the IC in operation S70 may be referred to as design polishing, as a post-processing to optimize the structure of the IC.

In operation S90, an operation of manufacturing an IC may be performed. For example, an IC may be manufactured by patterning a plurality of layers using at least one mask fabricated in operation S70. A frontside-end-of-line (FEOL) may include, for example, planarizing and cleaning a wafer, forming trenches, forming wells, forming gate lines, and forming a source and a drain. By the FEOL, individual devices, such as transistors, capacitors, resistors, etc. may be formed on the substrate. In addition, a back-end-of-line (BEOL) may include, for example, siliciding gate, source, and drain regions, adding a dielectric, planarizing, forming holes, adding metal layers, forming a via, and forming a passivation layer, etc. By the BEOL, individual devices, such as transistors, capacitors, resistors, etc. may be interconnected. In some embodiments, a middle-of-line (MOL) may be performed between the FEOL and the BEOL, and contacts may be formed on the individual devices. The IC may then be packaged in a semiconductor package and used as a component in a variety of applications.

Figure 15:
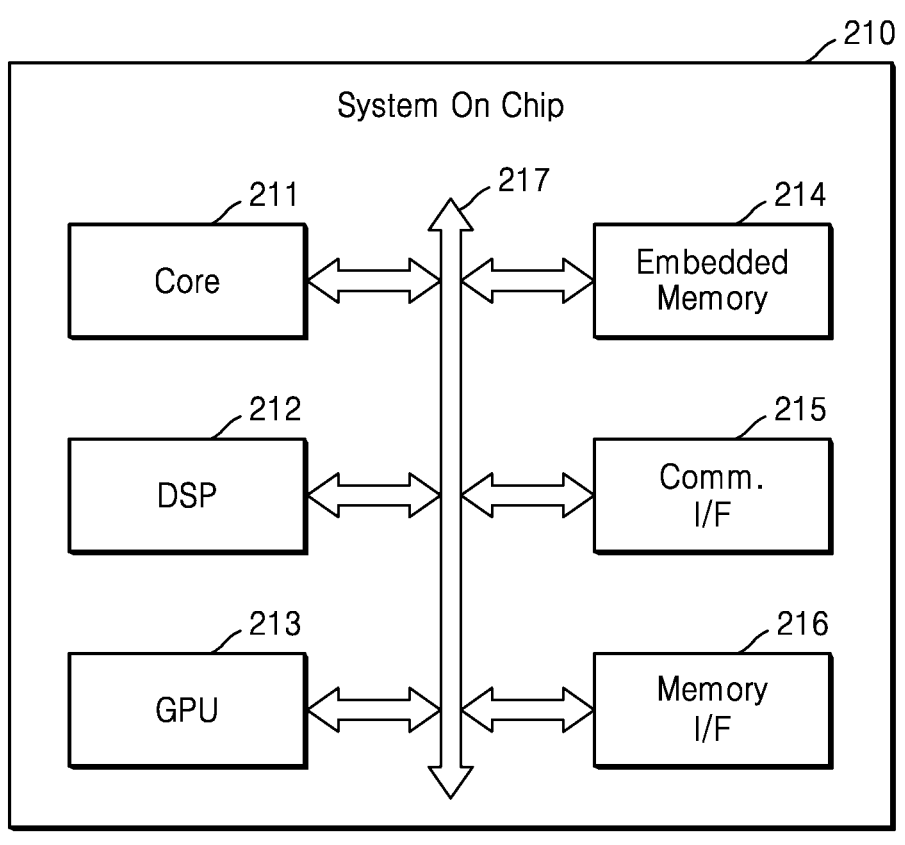
FIG. 15 is a block diagram illustrating a system-on-chip according to an embodiment.

FIG. 15 is a block diagram illustrating a system-on-chip (SoC) 210 according to an embodiment. Referring to FIG. 15, the SoC 210 may refer to an integrated circuit that integrates components of a computing system or other electronic system. For example, an application processor (AP), as an example of the SoC 210, may include a processor and components for other functions. The SoC 210 may include a core 211, a digital signal processor (DSP) 212, a graphics processing unit (GPU) 213, an embedded memory 214, a communication interface 215, and a memory interface 216. The components of the SoC 210 may communicate with each other through a bus 217.

The core 211 may process instructions and control the operation of components included in the SoC 210. For example, the core 211 may drive an operating system by processing a series of instructions and run applications on the operating system The DSP 212 may generate useful data by processing digital signals, for example, digital signals provided from the communication interface 215. The GPU 213 may generate data for an image output through a display device from image data provided from the embedded memory 214 or the memory interface 216, and may encode the image data. In some embodiments, the IC described above with reference to the drawings may be included in the core 211, DSP 212, GPU 213, and/or embedded memory 214.

The embedded memory 214 may store data necessary for the core 211, DSP 212, and GPU 213 to operate. The communication interface 215 may provide an interface for a communication network or one-to-one communication. The memory interface 216 may provide an interface to external memory of the SoC 210, such as DRAM and flash memory.

Figure 16:
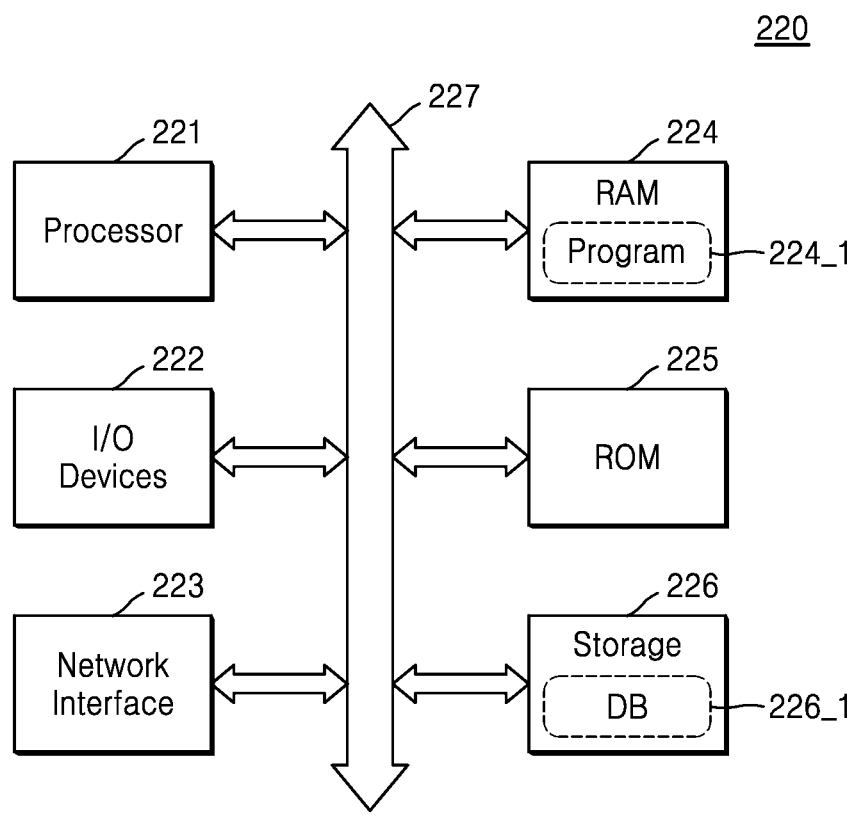
FIG. 16 is a block diagram illustrating a computing system including a memory storing a program, according to an embodiment.

FIG. 16 is a block diagram illustrating a computing system 220 including a memory for storing a program, according to an embodiment. Referring to FIG. 16, at least a portion of a method of designing an IC, e.g., at least some of the operations in the aforementioned flowchart, according to embodiments, may be performed on the computing system (or a computer) 220. The computing system 220 may include a processor 221, I/O devices 222, a network interface 223, random access memory (RAM) 224, read-only memory (ROM) 225, and a storage 226. The processor 221, I/O devices 222, network interface 223, RAM 224, ROM 225, and storage 226 may be connected to a bus 227 and communicate with each other through the bus 227.

The processor 221 may be referred to as a processing unit and may include at least one core capable of executing a certain instruction set (e.g., Intel Architecture-32 (IA-32), 64-bit extension IA-32, x86-64, PowerPC, Sparc, MIPS, ARM, IA-64, etc.), such as a micro-processor, an application processor (AP), a digital signal processor (DSP), or a graphic processing unit (GPU). For example, the processor 221 may access memory, that is, RAM 224 or ROM 225, through the bus 227 and execute instructions stored in RAM 224 or ROM 225.

The RAM 224 may store a program 224_1 or at least a portion thereof for a method of designing an IC according to an embodiment, and the program 224_1 may cause the processor 221 to design an IC, for example, at least some of the operations included in the method of FIG. 14. That is, the program 224_1 may include a plurality of instructions executable by the processor 221, and the instructions included in the program 224_1 may cause the processor 221 to perform, for example, at least some of the operations included in the flowchart described above.

The storage 226 may not lose stored data even if power supplied to the computing system 220 is cut off. The storage 226 may store the program 224_1 according to an embodiment, and the program 224_1 or at least a portion thereof may be loaded to the RAM 224 before the program 224_1 is executed by the processor 221. Alternatively, the storage 226 may store a file written in a program language, and the program 224_1 or at least a portion thereof generated by a compiler or the like from the file may be loaded into the RAM 224. In addition, the storage 226 may store a database (DB) 226_1 having information necessary for designing an IC, for example, information on designed blocks, the cell library D12 of FIG. 14, and/or the design rule D14.

The storage 226 may store data to be processed by the processor 221 or data processed by the processor 221. That is, the processor 221 may generate data by processing data stored in the storage 226 according to the program 224_1, and may store the generated data in the storage 226. For example, the storage 226 may store the RTL data D11, netlist data D13, and/or layout data D15 of FIG. 14.

The I/O devices 222 may include an input device, such as a keyboard, a pointing device, etc., and may include an output device, such as a display device, a printer, etc. For example, a user may trigger execution of program 224_1 by the processor 221, through the I/O devices 222, may input the RTL data D11 and/or netlist data D13 of FIG. 14, or identify the layout data D15 of FIG. 14. The network interface 223 may provide access to a network outside the computing system 220. For example, the network may include multiple computing systems and communication links, and the communication links may include wired links, optical links, wireless links, or any other type of links.

While certain embodiments of the disclosure have been particularly shown and described, it will be understood that various changes in form and details may be made therein without departing from the spirit and scope of the following claims.

What is claimed is:

1. An integrated circuit comprising:
a substrate;
a bit cell array comprising bit cells on the substrate;
a frontside wiring layer above the substrate in a vertical direction with respect to a front side of the substrate, the frontside wiring layer comprising local word lines connected to the bit cells;
a row decoder configured to provide word line signals for driving the bit cell array;
a backside wiring layer on a backside of the substrate, the backside wiring layer comprising backside wiring lines configured to receive the word line signals from the row decoder; and
a word line rebuffer configured to provide the word line signals received from the backside wiring lines to the local word lines.

2. The integrated circuit of claim 1, further comprising:
first backside vias connected between the row decoder and the backside wiring lines; and
second backside vias connected between the backside wiring lines and the word line rebuffer.

3. The integrated circuit of claim 1, wherein the backside wiring lines correspond to global word lines.

4. The integrated circuit of claim 3, wherein a first pitch of the global word lines corresponds to a second pitch of the local word lines.

5. The integrated circuit of claim 3, wherein a first number of the global word lines corresponds to a second number of local word lines connected to the word line rebuffer.

6. The integrated circuit of claim 1, wherein the frontside wiring layer further comprises frontside global word lines configured to receive the word line signals from the row decoder.

7. The integrated circuit of claim 6, wherein the frontside global word lines are connected between the row decoder and the word line rebuffer.

8. The integrated circuit of claim 6, wherein the backside wiring lines and the frontside global word lines extend in a first direction, and wherein a first length of each backside wiring line of the backside wiring lines is greater than a second length of each frontside global word line of the frontside global word lines.

9. The integrated circuit of claim 1, wherein the bit cell array includes a first bit cell array and a second bit cell array,
wherein the local word lines comprise first local word lines connected to the first bit cell array and second local word lines connected to the second bit cell array, and
wherein the word line rebuffer comprises:
a first word line rebuffer connected to the first local word lines; and
a second word line rebuffer connected to the second local word lines.

10. The integrated circuit of claim 1, wherein the bit cell array comprises a first bit cell array and a second bit cell array,
wherein the first bit cell array comprises first bit cells and second bit cells,
wherein the second bit cell array comprises third bit cells and fourth bit cells,
wherein the row decoder is located between the first bit cell array and the second bit cell array, and
wherein the local word lines comprise first local word lines connected to the first bit cells, second local word lines connected to the second bit cells, third local word lines connected to the third bit cells, and fourth local word lines connected to the fourth bit cells.

11. The integrated circuit of claim 10, wherein the row decoder is configured to provide first word line signals corresponding to the first bit cell array and second word line signals corresponding to the second bit cell array, and
wherein the backside wiring layer comprises:
first backside wiring lines configured to receive the first word line signals, and
second backside wiring lines configured to receive the second word line signals.

12. An integrated circuit comprising:
a substrate;
a bit cell array comprising first bit cells and second bit cells arranged on the substrate;
a frontside wiring layer above the substrate in a vertical direction with respect to a front side of the substrate, the frontside wiring layer comprising first local word lines connected to the first bit cells and second local word lines connected to the second bit cells;
a backside wiring layer on a backside of the substrate, the backside wiring layer comprising backside wiring lines;
a first row decoder configured to provide first word line signals according to a row address to the first local word lines and transmit the row address to the backside wiring lines; and
a second row decoder configured to receive the row address from the backside wiring lines and provide second word line signals according to the row address to the second local word lines.

13. The integrated circuit of claim 12, further comprising:
first backside vias connecting the backside wiring lines to the first row decoder; and
second backside vias connecting the backside wiring lines to the second row decoder,
wherein the first row decoder is further configured to transmit the row address to the backside wiring lines through the first backside vias, and wherein the backside wiring lines are configured to transmit the row address to the second row decoder through the second backside vias.

14. The integrated circuit of claim 13, wherein a first pitch of the backside wiring lines is greater than a second pitch of the first local word lines and greater than a third pitch of the second local word lines.

15. The integrated circuit of claim 13, wherein a first number of the backside wiring lines is less than a second number of first local word lines and is less than a third number of second local word lines.

16. The integrated circuit of claim 12, wherein the bit cell array comprises:

a first bit cell array comprising the first bit cells and the second bit cells, and a second bit cell array comprising third bit cells and fourth bit cells, wherein the frontside wiring layer further comprises third local word lines connected to the third bit cells and fourth local word lines connected to the fourth bit cells, and wherein the first row decoder is between the first bit cell array and the second bit cell array and is further configured to provide third word line signals according to the row address to the third local word lines.

17. The integrated circuit of claim 16, further comprising:

a third row decoder configured to provide fourth word line signals according to the row address to the fourth local word lines; and third backside vias connecting the backside wiring lines to the third row decoder, wherein the backside wiring lines are configured to transmit the row address to the third row decoder through the third backside vias.

18. The integrated circuit of claim 12, wherein the first row decoder comprises a main row decoder configured to drive the bit cell array, and wherein the second row decoder comprises a sub-row decoder configured to drive the second bit cells.

19. An integrated circuit comprising:

a substrate;

a bit cell array comprising first bit cells and second bit cells arranged on the substrate;

a frontside wiring layer above the substrate in a vertical direction with respect to a front side of the substrate, the frontside wiring layer comprising first local word lines connected to the first bit cells and second local word lines connected to the second bit cells;

a backside wiring layer on a backside of the substrate, the backside wiring layer comprising backside global word lines configured to receive word line signals for driving the bit cell array; and backside vias respectively on the backside global word lines, wherein the first local word lines or the second local word lines are configured to receive the word line signals from the backside global word lines through the backside vias.

20. The integrated circuit of claim 19, further comprising a word line rebuffer configured to receive the word line signals from the backside global word lines and provide the word line signals to the first local word lines or the second local word lines.

* * * * *